United States Patent
Rabkin et al.

(10) Patent No.: US 9,443,865 B2
(45) Date of Patent: Sep. 13, 2016

(54) FABRICATING 3D NAND MEMORY HAVING MONOLITHIC CRYSTALLINE SILICON VERTICAL NAND CHANNEL

(71) Applicant: SanDisk Technologies Inc., Plano, TX (US)

(72) Inventors: Peter Rabkin, Cupertino, CA (US); Jayavel Pachamuthu, San Jose, CA (US); Johann Alsmeier, San Jose, CA (US); Masaaki Higashitani, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 48 days.

(21) Appl. No.: 14/575,937

(22) Filed: Dec. 18, 2014

(65) Prior Publication Data
US 2016/0181272 A1 Jun. 23, 2016

(51) Int. Cl.
*H01L 21/02* (2006.01)
*H01L 21/324* (2006.01)
*H01L 27/115* (2006.01)

(52) U.S. Cl.
CPC ..... *H01L 27/11582* (2013.01); *H01L 21/0217* (2013.01); *H01L 21/0262* (2013.01);
(Continued)

(58) Field of Classification Search
CPC .......... H01L 27/11582; H01L 21/02598; H01L 21/0262; H01L 21/02603; H01L 21/0217; H01L 27/11556; H01L 21/02164; H01L 21/02532; H01L 21/324; H01L 29/7926; H01L 27/11568; H01L 29/7889; H01L 21/32053; H01L 27/11524; H01L 27/1157; H01L 21/283; H01L 21/28556; H01L 21/31144; H01L 21/32055; H01L 27/1159; H01L 27/2481; H01L 29/0676
USPC ........................................... 438/591; 257/324
See application file for complete search history.

(56) References Cited

U.S. PATENT DOCUMENTS 4,655,849 A 4/1987 Schachameyer et al.
7,847,334 B2 12/2010 Katsumata et al.
(Continued)

FOREIGN PATENT DOCUMENTS

JP 56073694 * 6/1981 ............. H01L 21/02

OTHER PUBLICATIONS

Chung, Keith, et al., "Silicon-Based Epitaxy by Chemical Vapor Deposition Using Novel Precursor Neopentasilane," Dissertation presented to the Facility of Princeton University, May 2010, 14 pages.
(Continued)

*Primary Examiner* — Caleen Sullivan
(74) *Attorney, Agent, or Firm* — Vierra Magen Marcus LLP

(57) ABSTRACT

Disclosed herein are techniques for fabricating 3D NAND memory devices having a mono-crystalline silicon semiconductor vertical NAND channel. Memory holes are formed in horizontal layers of material above a substrate. A vertically-oriented NAND string is formed in each of the memory holes. Forming the vertically-oriented NAND string channel comprises growing monolithic crystalline silicon upwards in the memory hole from the substrate through all of the plurality of horizontal layers of material. Vapor phase epitaxial growth may be used grow the monolithic crystalline silicon upwards from the bottom of the vertically-oriented NAND channel. Alternatively, a nanowire of monolithic crystalline silicon is synthesized in the memory hole from the substrate at the bottom of the vertically-oriented NAND channel upwards to the top of the vertically-oriented NAND channel.

22 Claims, 34 Drawing Sheets

(52) U.S. Cl.
CPC ... *H01L21/02164* (2013.01); *H01L 21/02532* (2013.01); *H01L 21/02598* (2013.01); *H01L 21/02603* (2013.01); *H01L 21/324* (2013.01); *H01L 27/11556* (2013.01)

(56) References Cited

U.S. PATENT DOCUMENTS

| | | | |
|---|---|---|---|
| 7,859,066 | B2 | 12/2010 | Kito et al. |
| 8,445,347 | B2 | 5/2013 | Alsmeier |
| 8,501,609 | B2 | 8/2013 | Roizin et al. |
| 8,524,616 | B2 | 9/2013 | Kim et al. |
| 8,599,616 | B2 | 12/2013 | Roizin et al. |
| 8,610,193 | B2 | 12/2013 | Ramaswamy |
| 2007/0166899 | A1* | 7/2007 | Yao .......................... C30B 11/12 438/162 |
| 2011/0240114 | A1 | 10/2011 | Stewart et al. |
| 2011/0298013 | A1 | 12/2011 | Hwang et al. |
| 2012/0256247 | A1* | 10/2012 | Alsmeier .............. H01L 21/764 257/319 |
| 2013/0234130 | A1 | 9/2013 | Ino |
| 2013/0341701 | A1 | 12/2013 | Blomme et al. |
| 2013/0341702 | A1 | 12/2013 | Kar et al. |
| 2014/0285224 | A1* | 9/2014 | Albuschies ............ B82Y 40/00 324/691 |

OTHER PUBLICATIONS

Schmidt, Jan, et al., Surface passivation of silicon solar cells using plasma-enhanced chemical-vapour-desposited siN films and thin thermal SiO2/plasma SiN stacks, Semiconductor Science and Technology, vol. 16, Dec. 13, 2000, 7 pages.

Park, Won II, et al. "Controlled Synthesis of Millimeter-Long Silicon Nanowires with Uniform Electronic Properties," Nano Letters, vol. 8, No. 9, Aug. 6, 2008, 6 pages.

* cited by examiner

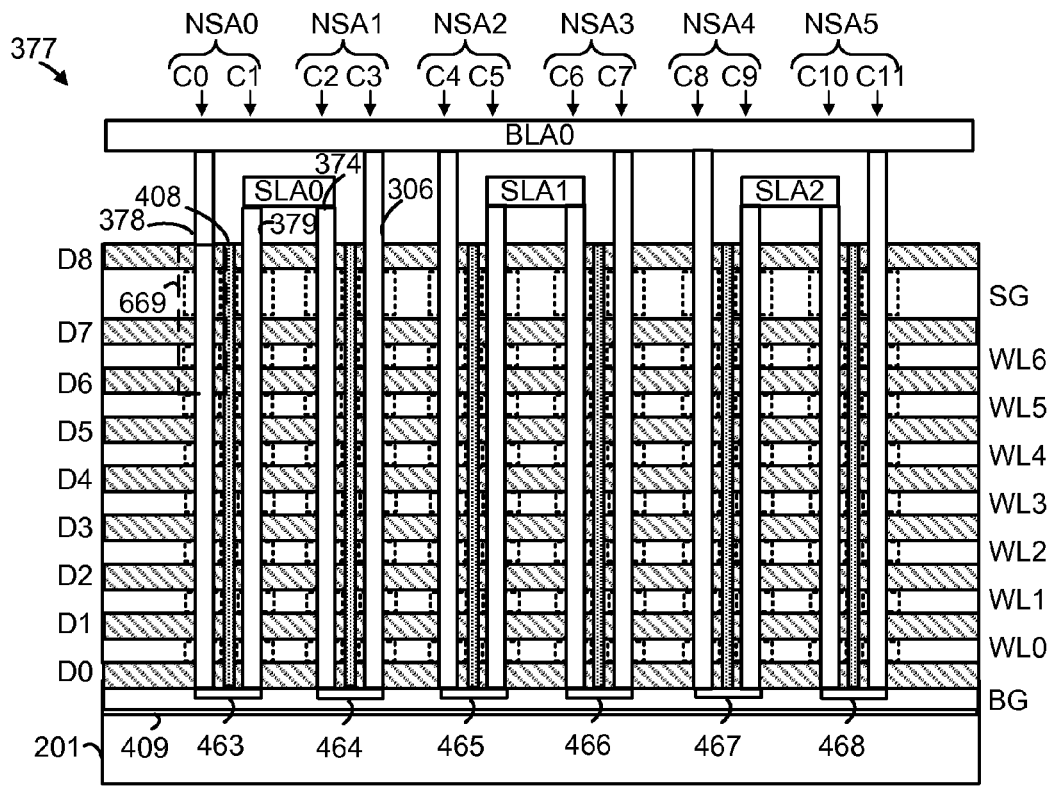

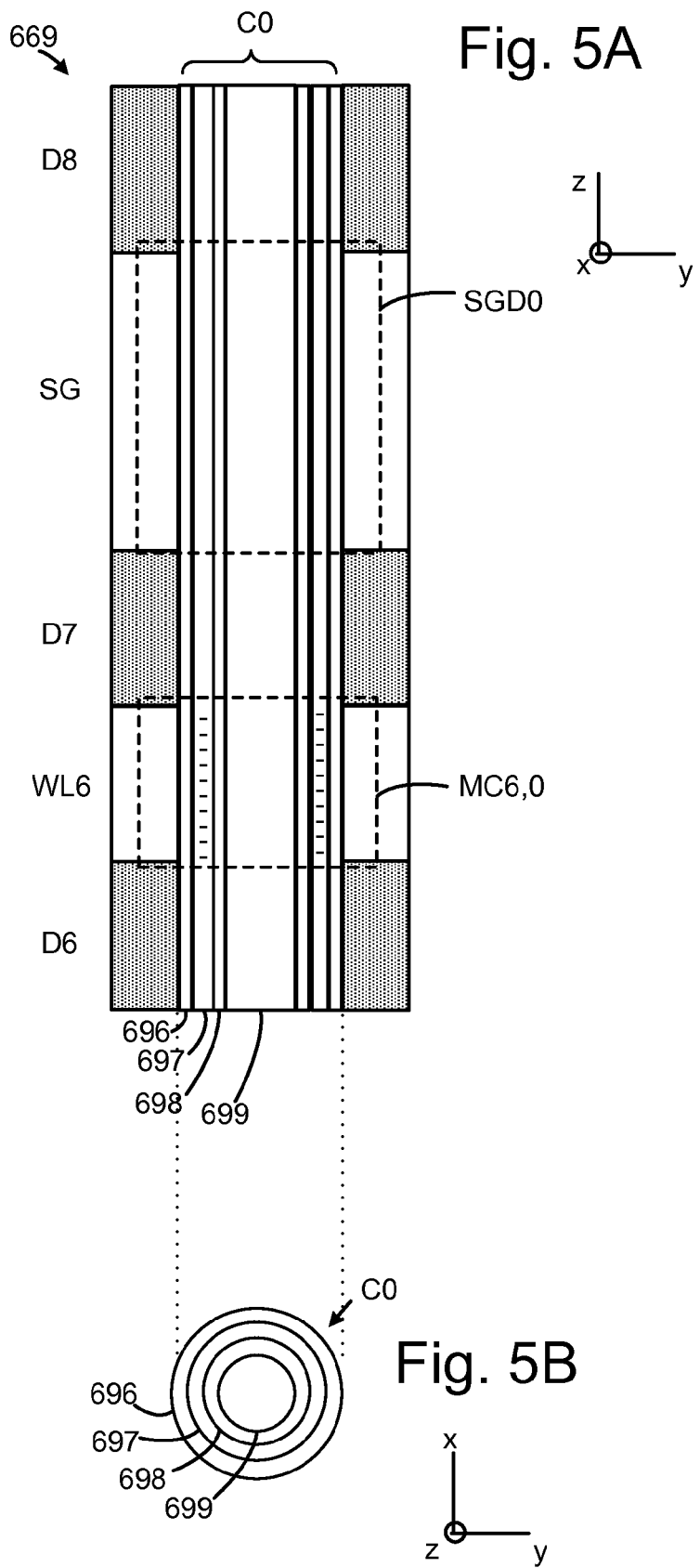

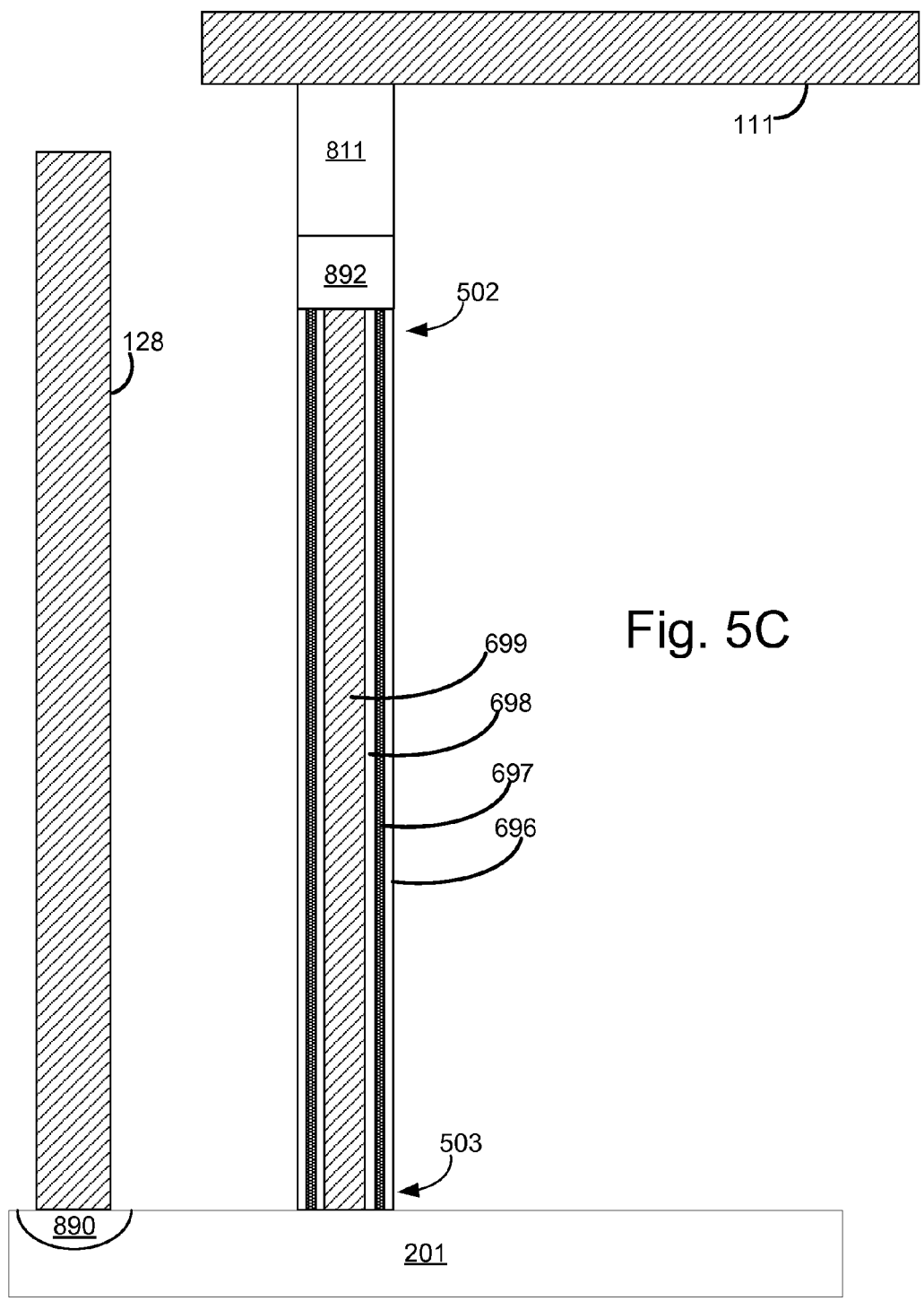

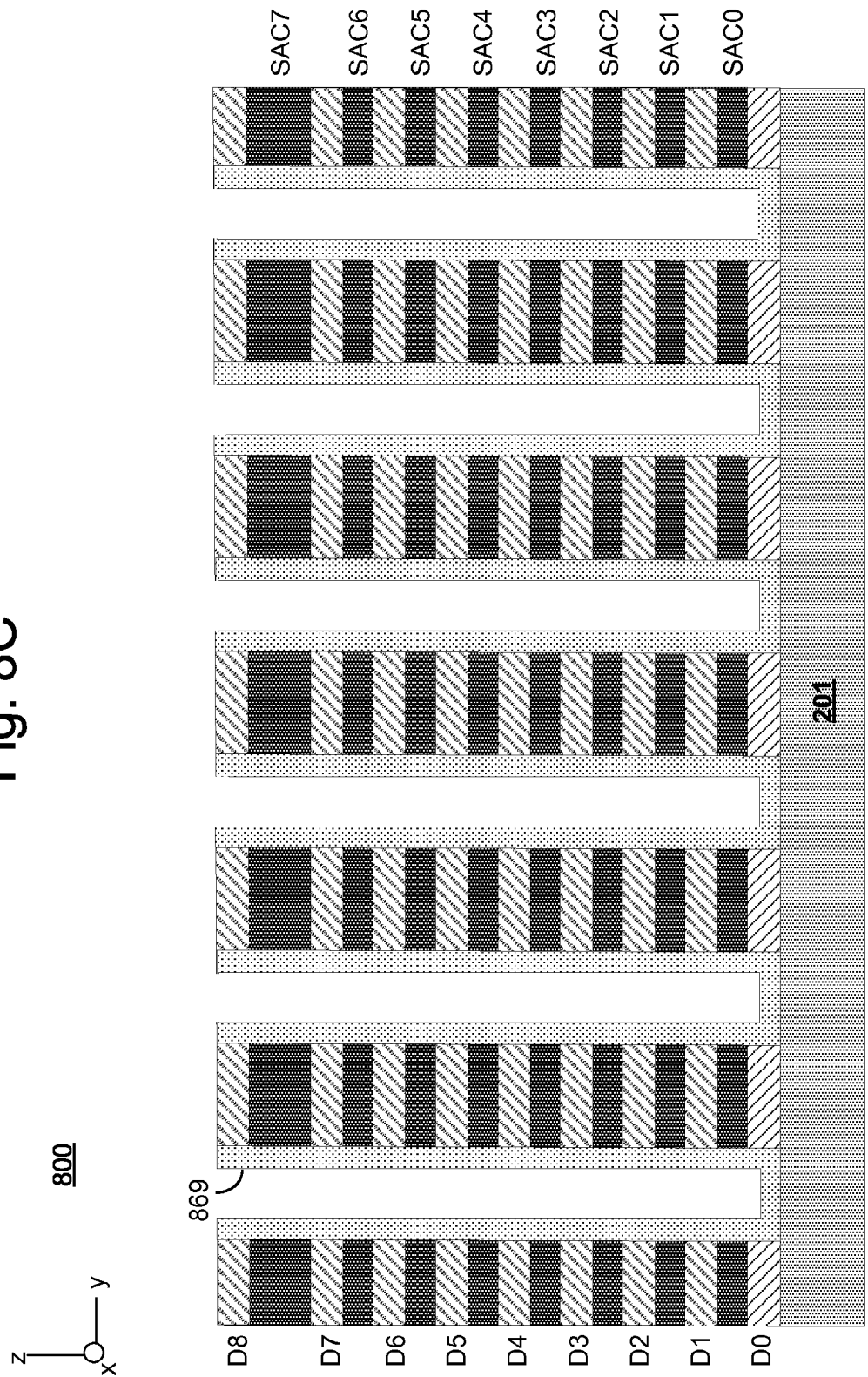

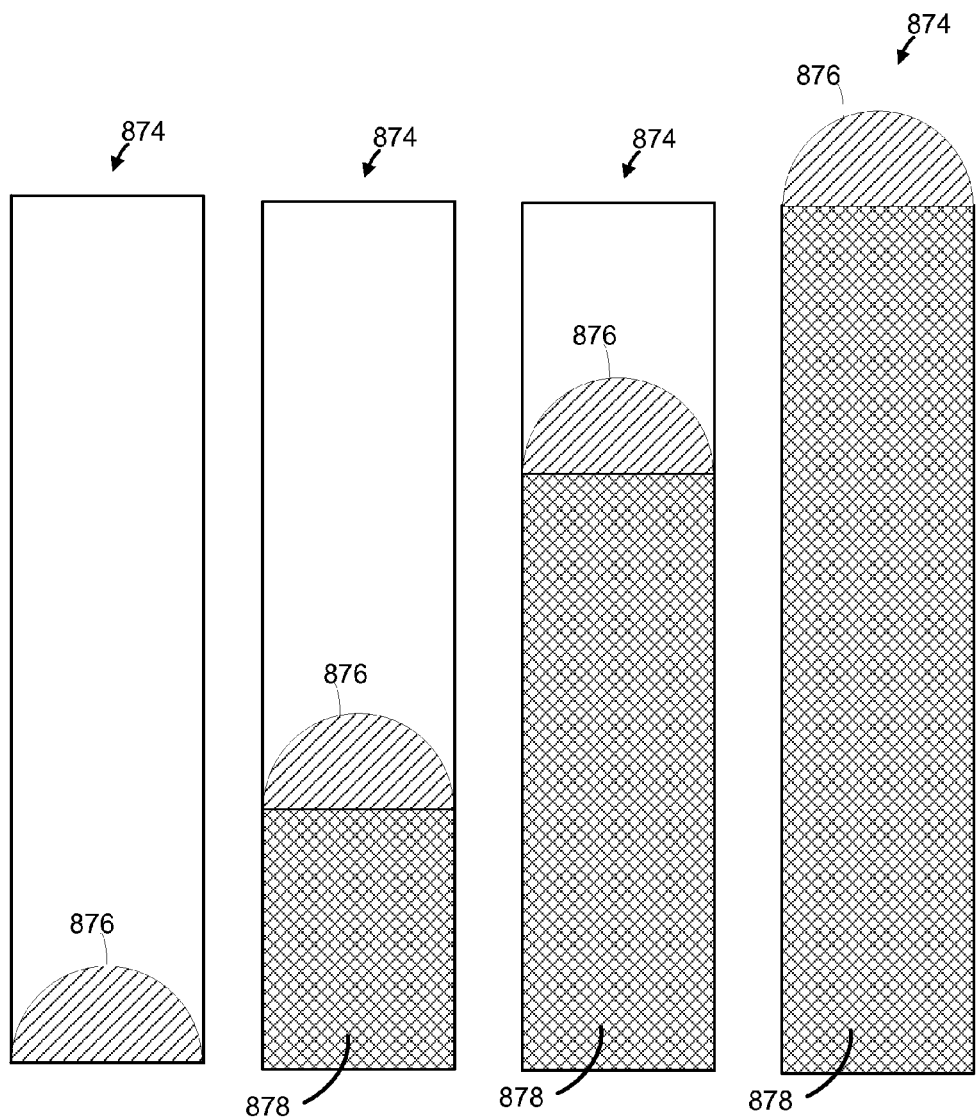

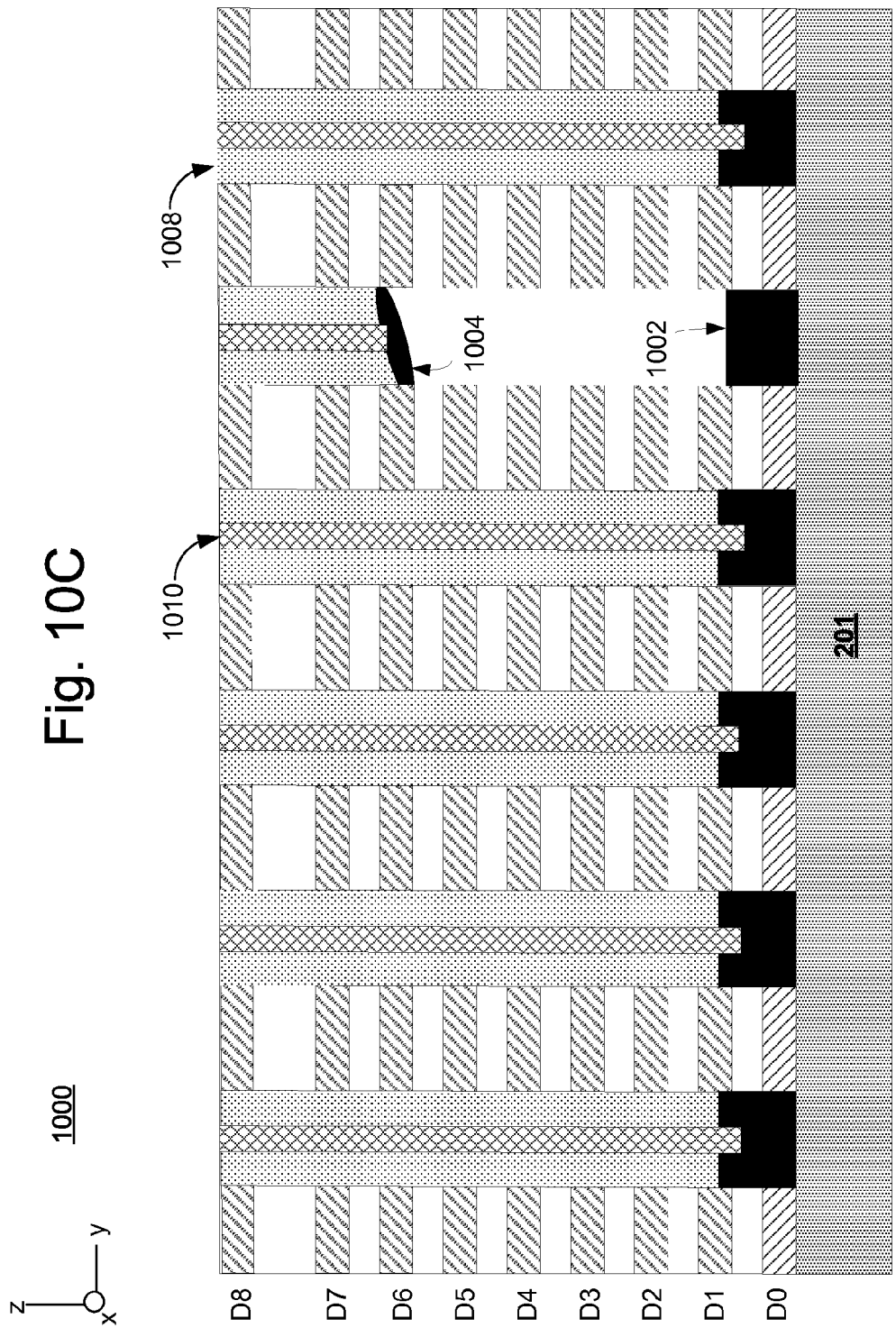

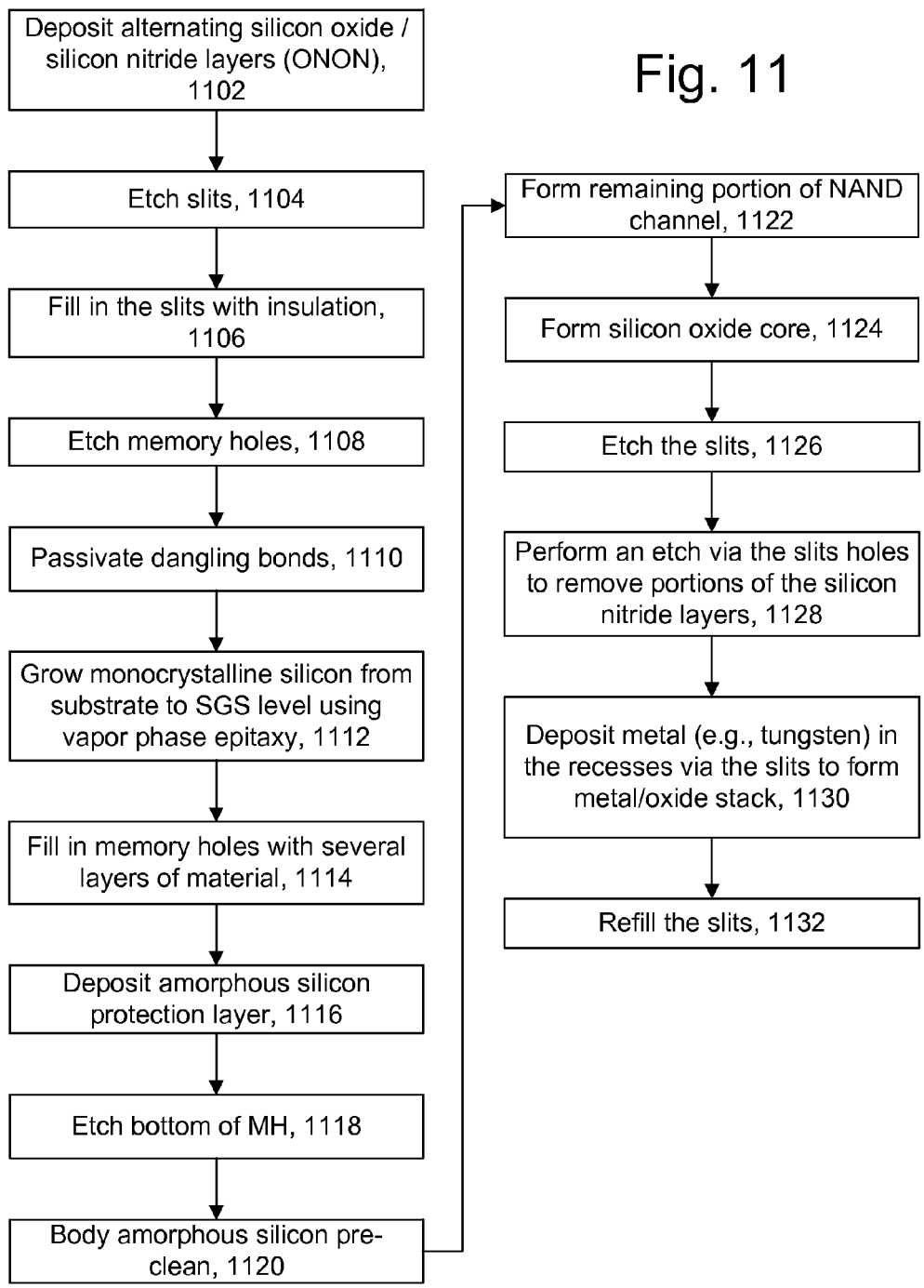

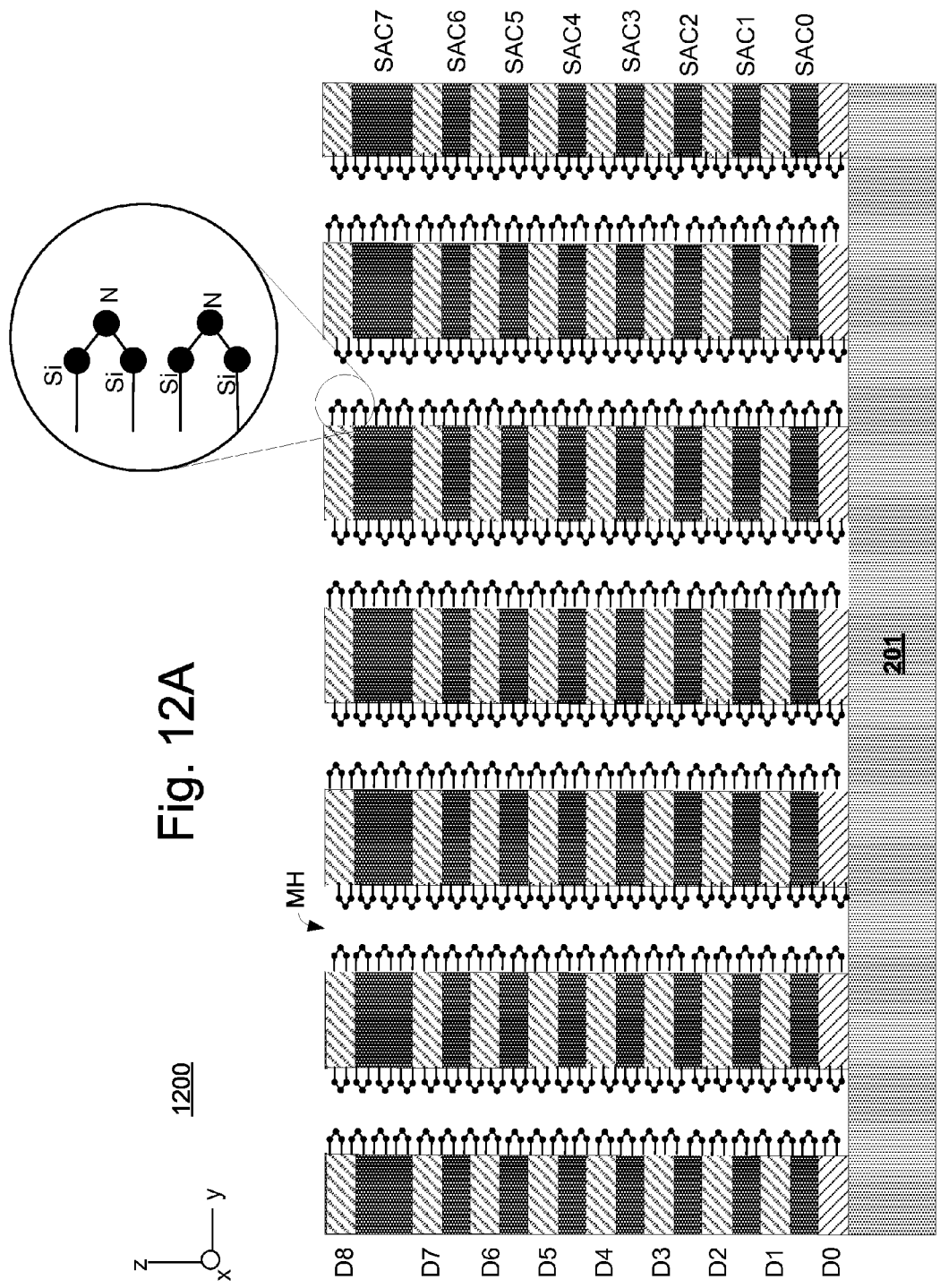

FABRICATING 3D NAND MEMORY HAVING MONOLITHIC CRYSTALLINE SILICON VERTICAL NAND CHANNEL

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

BRIEF DESCRIPTION OF THE DRAWINGS

Like-numbered elements refer to common components in the different figures.

FIG. 3B depicts a cross-sectional view of a block of the 3D non-volatile memory device of FIG. 3A of SetA0 of NAND strings of FIG. 3A.

FIG. 5A depicts a close-up view of the region 669 of the column C0 of FIG. 3B, showing a drain-side select gate SGD0 and a memory cell MC6,0.

FIG. 5B depicts a cross-sectional view of the column C0 of FIG. 5A.

FIG. 5C depicts electrical connections between one embodiment of a mono-crystalline silicon vertical NAND channel and a bit line and a source line.

FIGS. 10A-10D depict clogging of memory holes that could occur due to unintentional nucleation sites on sidewalls of memory holes.

FIG. 11 is flowchart describing one embodiment of a process for passivating unintentional nucleation sites on sidewalls of memory holes when forming NAND strings.

FIGS. 12A-12D show results after various points for the process of FIG. 11.

DETAILED DESCRIPTION

Figure 1:
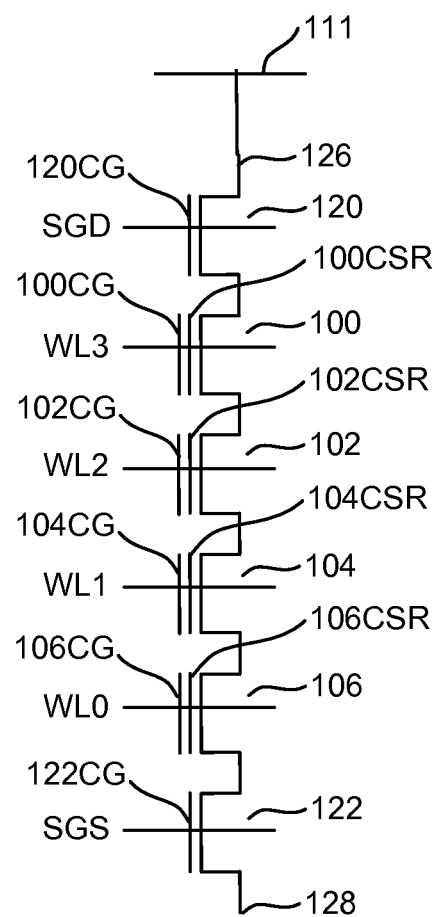
FIG. 1 is a circuit representation of a NAND string.

Disclosed herein are methods for forming 3D NAND memory devices having a monolithic crystalline (or "mono-crystalline") silicon vertical NAND string channel.

One parameter of note in 3D NAND memory devices is the "on current" of the memory cell on the NAND string, which is referred to as $I_{CELL}$. A higher $I_{CELL}$ can provide better sensing margin. Another parameter of note in 3D NAND memory devices is the sub-threshold slope, which may be defined as the slope of the Vgs/$I_{CELL}$ curve below the memory cell's threshold voltage. The sub-threshold slope, often measured in mV/decade, generally describes Vgs voltage increase necessary to increase Icell by one order of magnitude. A low slope means that a smaller Vgs increase is needed for a certain Icell increase. When the sub-threshold slope is smaller, the Icell-Vgs curve shows sharper increase of Icell current with every incremental Vgs voltage increase. A low (e.g., relatively flat) slope can make it easier to determine which memory cells are off. Another parameter of note in 3D NAND memory devices is select gate leakage. This refers to leakage of select gates that connect/disconnect the NAND string from a bit line or source line. Another parameter of note in 3D NAND memory devices is carrier generation, including trap assisted generation, band-to-band (BTB) generation. Low carrier generation can significantly improve boosting during programming. Also, low carrier generation can reduce program disturb. This can reduce the need to use complicated boosting schemes. This, in turn, can simplify chip design and reduce chip size.

Note that NAND having polysilicon channels can have a significant number of defects at grain boundaries. These defects may increase leakage, increase trap assisted carrier generation, reduce cell on current, reduce mobility of charge carriers, and introduce variability of device parameters. The monolithic crystalline silicon NAND string vertical channel of one embodiment has no grain boundaries and no associated defects/traps. Thus, the adverse effects that such defects/traps have on electron mobility and channel leakage are avoided.

One embodiment of a 3D NAND memory device having a mono-crystalline silicon vertical NAND channel has a high on current (e.g., high $I_{CELL}$). One embodiment of a 3D NAND memory device having a mono-crystalline silicon vertical NAND channel has a low sub-threshold slope. Thus, the memory cell turns on fast (e.g., Icell increases sharply with an increment in Vg). One embodiment of a 3D NAND memory device having a mono-crystalline silicon vertical NAND channel has a low select gate leakage. One embodiment of a 3D NAND memory device having a mono-crystalline silicon vertical NAND channel has low carrier generation.

Additionally, in one embodiment, the NAND string channels having a mono-crystalline silicon channel in a 3D NAND memory device are fabricated without a high temperature anneal. High temperatures during fabrication can harm elements such as transistors. For example, CMOS transistors that are formed in a peripheral region of the memory device prior to the 3D NAND memory array could be harmed during a high temperature anneal associated with formation of 3D memory devices. However, the mono-crystalline silicon vertical NAND channel is formed in one embodiment without a high temperature anneal.

In one embodiment, the NAND string channels have a solid core of monolithic crystalline silicon. Thus, there is no need for a core filler of, for example, silicon oxide. This allows the 3D memory device to be scaled down in size.

In one embodiment, the vertical NAND channels are formed using vapor phase epitaxial growth to grow the mono-crystalline silicon from the bottom of the vertically-oriented channel upwards to the top of the vertically-oriented channel. This may include forming the NAND strings in vertical memory holes. When forming the vertical NAND channels, silicon nucleation sites could be present on vertical sidewalls of the vertical memory holes. Such nucleation sites could potentially lead to formation of silicon on the vertical sidewalls, which could block the memory hole prior to the mono-crystalline silicon being grown up from the bottom. In one embodiment, a nitrogen gas flow is used to passivate silicon nucleation sites on the vertical sidewalls prior to growing mono-crystalline silicon upwards from the substrate. This allows the mono-crystalline silicon to be grown fully from the bottom to the top of the memory holes. This passivation technique can also be used when forming mono-crystalline silicon only in the lower portion of the memory holes. Thus, one embodiment of the passivation technique allows the mono-crystalline silicon to be grown from substrate to one of the lower layers of the memory device, without blockage of the memory hole at a higher layer.

Growing mono-crystalline silicon using vapor phase epitaxial growth can potentially be a slow process. If the process is too slow, the product may not be commercially viable. One embodiment includes using neopentosilane as a precursor when growing mono-crystalline silicon using vapor phase epitaxial growth. This results in fast growth of mono-crystalline silicon from bottom up.

In one embodiment, the vertical NAND channels are formed by synthesizing a nanowire of mono-crystalline silicon from the substrate at the bottom of the vertically-oriented NAND channel upwards to the top of the vertically-oriented NAND channel. In one embodiment, vapor-liquid-solid (VLS) synthesis is used.

In one embodiment, the VLS comprises the following. Gold nanoclusters are formed in the memory holes on the substrate. The gold nanoclusters may serve as a catalyst for growth of mono-crystalline silicon. A reactant source of silicon is introduced into the memory holes. An example of the reactant is disilane ($Si_2H_6$). A thermal anneal is performed at a temperature higher than the gold-silicon eutectic point. The foregoing results in growing a nanowire of mono-crystalline silicon from the bottom upwards in a vertical memory hole.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a circuit representation of a NAND string. The NAND string depicted in FIG. 1 includes four transistors 100, 102, 104 and 106 in series and sandwiched between (drain side) select gate 120 and (source side) select gate 122. Select gate 120 connects the NAND string to a bit line 111. Select gate 122 connects the NAND string to source line 128. Select gate 120 is controlled by applying the appropriate voltages to select line SGD. Select gate 122 is controlled by applying the appropriate voltages to select line SGS.

Each of the transistors 100, 102, 104 and 106 has a control gate (CG) and a charge storage region (CSR). For example, transistor 100 has control gate 100CG charge storage region 1600CSR. Transistor 102 includes control gate 102CG and a charge storage region 102CSR. Transistor 104 includes control gate 104CG and charge storage region 104CSR. Transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select gate controlled by select line SGS and connected to its associated bit line by its drain select gate controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of silicon oxide, silicon nitride and silicon oxide ("ONO") is sandwiched between a conductive control gate and the memory cell channel. For example, the ONO may be $Al_2O_3$—SiN—$SiO_2$. In the direction from control gate toward the center of memory hole, the first oxide (e.g., $Al_2O_3$) is a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the center of MH, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

Figure 2:
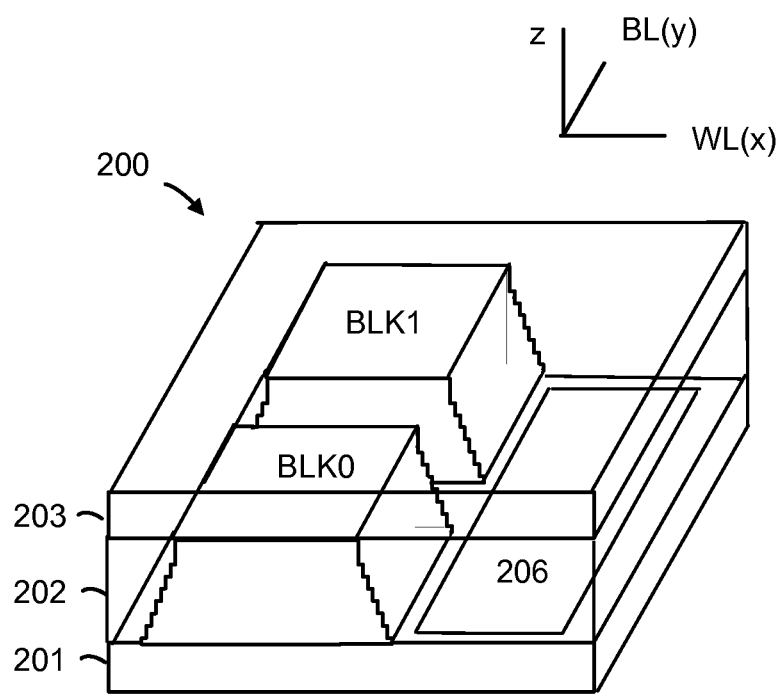
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing an x-direction (or bit line (BL) direction), a y-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3A:
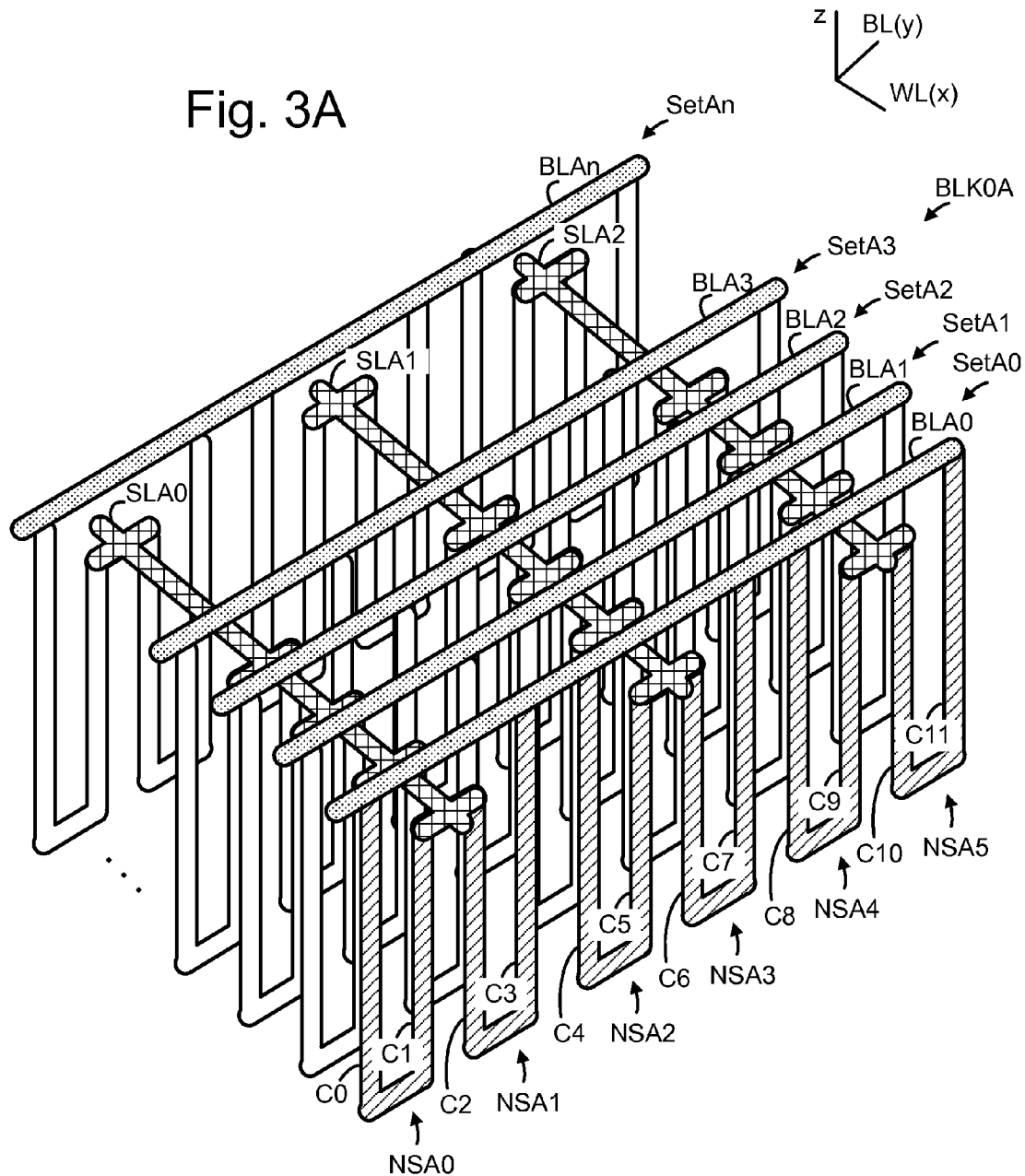
FIG. 3A depicts an embodiment of block BLK0 of FIG. 2 which includes U-shaped NAND strings.

In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 306 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select gate in the SG layer. A region 669 of the stack is shown in greater detail in FIG. 5A.

Figure 4A:
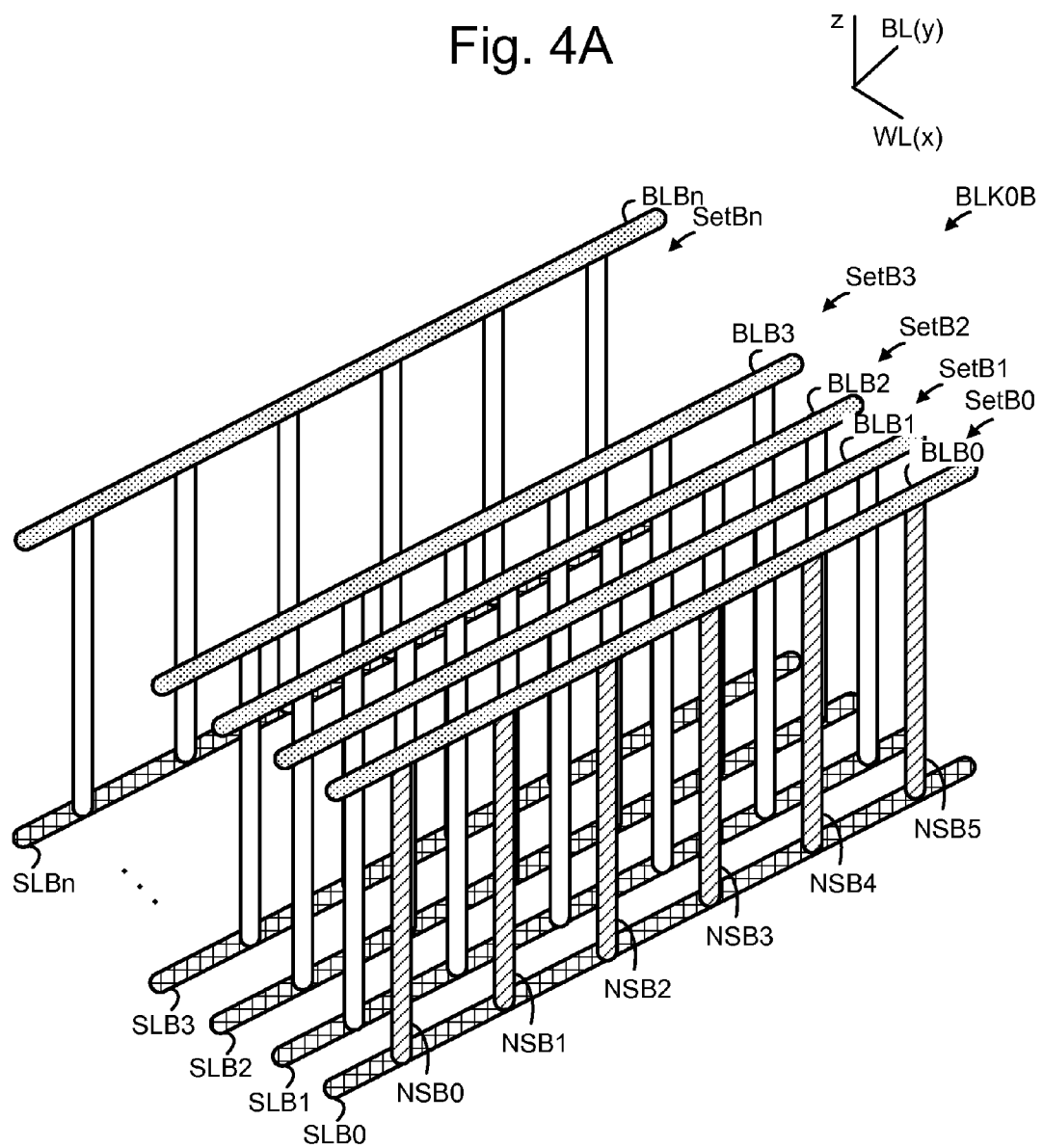
FIG. 4A depicts an embodiment of block BLK0 of FIG. 2 which includes straight NAND strings.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
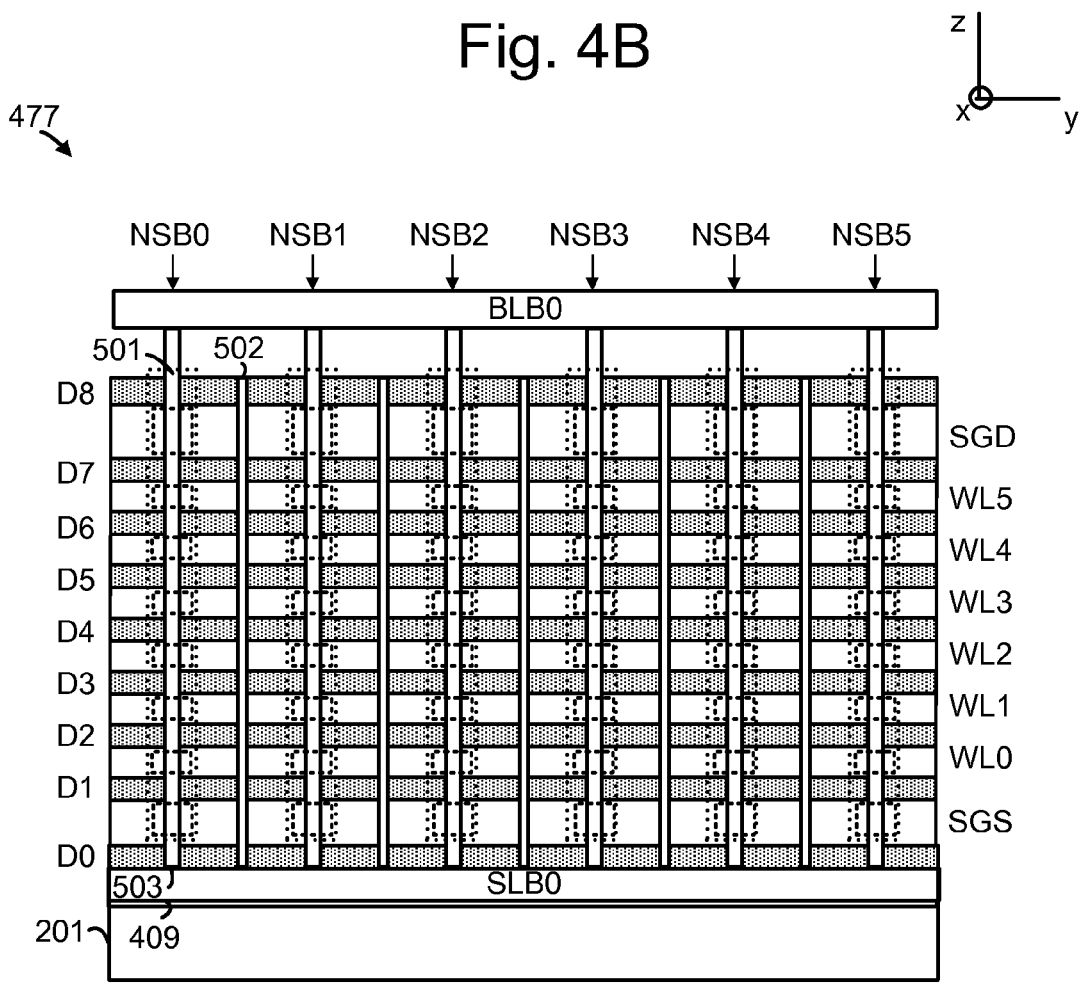
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 503 and a drain end 501. A slit 502 is also depicted with other slits. A portion of the bit line BLB0 is also depicted. Dashed lines depict memory cells and select gates, as discussed further below.

Figure 4C:
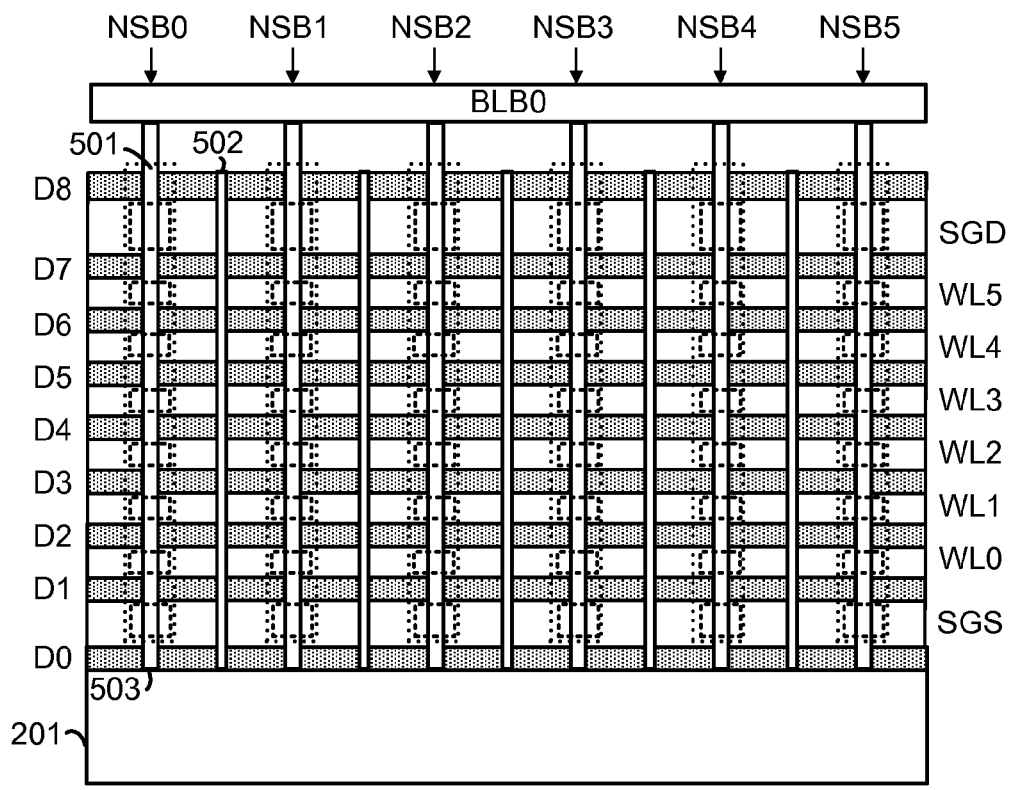
FIG. 4C depicts a cross-sectional view of a block of a 3D non-volatile memory device having straight strings.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the substrate 201. The substrate 201 may be silicon. The source line is not depicted in FIG. 4C.

FIG. 5A depicts a close-up view of the region 669 of the column C0 of FIG. 3B, showing a drain-side select gate SGD0 and a memory cell MC6,0. FIG. 5B depicts a cross-sectional view of the column C0 of FIG. 5A. Each layer is shaped as a hollow cylinder in one possible approach, except the NAND string channel 699, which is a solid cylinder in this embodiment. The horizontal cross section of the cylinders may be circular. However, it is not required that the horizontal cross section of the cylinders be circular. In one embodiment, the horizontal cross section of the cylinders is an ellipse. The horizontal cross section of the cylinders could deviate from a perfectly circular or perfectly elliptical shape. Also note that the size (e.g., width in the x-y plane) of the column can vary from top to bottom. Thus, the radius of the cylinders could vary from top to bottom. Thus, the term "cylindrical" as used herein does not require a constant radius from top to bottom. This, the term "cylindrical" as used herein allows for some tapering. Recall that region 669 of the column C0 of FIG. 3B is for the U-shaped 3D NAND string example. However, the diagrams and discussion for FIGS. 5A and 5B also apply to a straight 3D NAND string, such as the examples of FIGS. 4A-4C.

The region 669 shows portions of the dielectric layers D6 to D8 and the conductive layers WL6 and SG. Each column includes a number of layers which are deposited along the sidewalls of the column. These layers can include oxide-nitride-oxide and mono-crystalline silicon layers which may be formed using a variety of techniques. For example, atomic layer deposition could be used to deposit one or more of the layers. For example, a block oxide (or blocking layer) can be deposited as layer 696, a nitride such as SiN as a charge trapping layer (e.g., charge storage region CSR) can be deposited as layer 697, a tunnel oxide (or tunneling layer) can be deposited as layer 698, a mono-crystalline silicon body or channel can be formed as layer 699. The block oxide layer 696 and the tunnel oxide layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel oxide layer 698 comprises a stack of oxide, nitride and oxide films. The semiconductor body or channel 699 may also be referred to as an active area. Additional memory cells are similarly formed throughout the columns.

As will be discussed more fully below, the semiconductor body or channel of some embodiments of the vertical NAND string has a mono-crystalline silicon structure throughout the entire NAND channel. For example, the vertical NAND string has a mono-crystalline silicon structure from the bottom to the top of the NAND channel. A vertical NAND string channel having a mono-crystalline silicon structure may have a high $I_{CELL}$, low sub-threshold slope, low select gate leakage, and/or low carrier generation.

Note that in some embodiments the vertical NAND string is not mono-crystalline silicon throughout the entire NAND channel. In some embodiments, the vertical NAND string is mono-crystalline only at the bottom of the NAND channel. For example, in some embodiments, the vertical NAND string is mono-crystalline only up to about the SGS layer (see SGS layer in FIG. 4B).

When a memory cell such as depicted in FIG. 5A is programmed, electrons are stored in a portion of the charge trapping layer which is associated with the memory cell. For example, electrons are represented by "−" symbols in the charge trapping layer 697 for MC6,0. These electrons are drawn into the charge trapping layer from the semiconductor body, and through the tunnel oxide. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and drain side select gate bias (SGD), and similarly, between source line bias and source side select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

FIG. 5C shows electrical connections between the mono-crystalline silicon vertical NAND channel 699 and a bit line 111 and a source line 128. The mono-crystalline silicon channel 699 is in direct physical and direct electrical contact with the substrate 201, which may be formed from silicon. The source line 128 is in electrical contact with a source 890 that is formed in the substrate 201. The source may be an n+ region. Thus, source 890 can be formed by heavily doping a silicon substrate. The source line 128 is formed from metal, in one embodiment. Example metals include, but are not limited to, titanium, tungsten, copper, aluminum, and molybdenum. Note that the source line 128 may serve as a common source line for a number of NAND strings. For example, all of the NAND strings depicted in FIG. 4C may share a common source line.

The drain end 501 of the mono-crystalline silicon NAND string channel 699 is in direct physical and electrical contact with a drain 892. In one embodiment, the drain 892 is a heavily doped silicon region (e.g., n+ region). The bit line contact 811 is formed from metal, in one embodiment. Likewise, the bit line 111 is formed from metal, in one embodiment. Example metals for the bit line and bit line contact include, but are not limited to, titanium, tungsten, copper, aluminum, and molybdenum.

Note that in FIGS. 5A-5C, the mono-crystalline silicon NAND string channel 699 is a solid core. Thus, there is no need for a silicon oxide or other core filler. This allows the 3D NAND memory to be scaled down to a smaller size.

Figure 6:
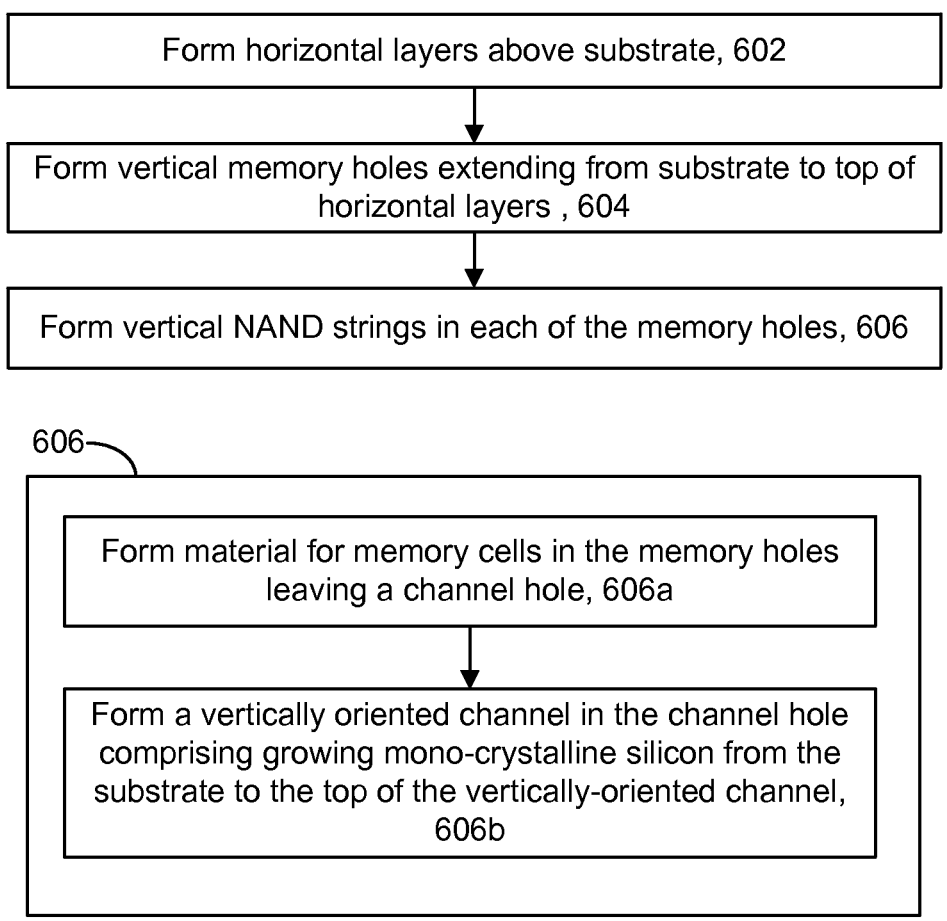
FIG. 6 is a flowchart depicting one embodiment of a process for fabricating 3D NAND memory having a mono-crystalline silicon vertical NAND channel.

FIG. 6 is a flowchart depicting one embodiment of a process for fabricating 3D NAND memory having a mono-crystalline silicon vertical NAND channel. This process could be used to form 3D NAND having straight NAND strings or U-shaped NAND strings.

Step 602 is to form horizontal layers of material above a substrate. The substrate is a silicon substrate, in one embodiment. The horizontal layers are alternating layers of silicon oxide and silicon nitride, in one embodiment. The silicon oxide layers may be for insulating layers such as D0-D8. The silicon nitride is sacrificial material, which will be replaced with metal or some other conductive material. The metal (or other conductor) is for select gate layers (e.g., SGS, SGD) and word line layers (e.g., WL0-WL5). This replacement can be performed either before or after the NAND strings are formed.

Therefore, one embodiment of step 602 is to form alternating layers of silicon oxide and silicon nitride. Another embodiment of step 602 is to form alternating layers of silicon oxide and metal (or some other conductor). As noted, forming alternating layers of silicon oxide and metal can be achieved by replacing sacrificial silicon nitride with metal.

Step 604 is to form vertical memory holes extending from the substrate to the top layer of the horizontal layers that were formed in step 602. In one embodiment, the vertical memory holes are formed through alternating layers of silicon oxide and silicon nitride. In one embodiment, the vertical memory holes are formed through alternating layers of silicon oxide and metal.

Step 606 is forming vertical NAND strings in each of the memory holes. Step 606 includes step 606a of forming material for memory cells in the memory holes, which leaves a channel hole in the central portion of each memory hole. The material for the memory cells surrounds the channel hole. Step 606a includes forming layers such as a block oxide (or blocking) layer 696, a nitride such as SiN charge trapping layer 697, a tunnel oxide (or tunneling) layer 698. The block oxide layer 696 and the tunnel oxide layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel oxide layer 698 comprises a stack of oxide, nitride and oxide films.

Step 606 also includes step 606b of forming a vertically oriented NAND string channel in the channel hole. Step 606b comprises growing mono-crystalline silicon from the substrate (e.g., silicon substrate) upwards to the top of the vertically oriented channel. Thus, the mono-crystalline silicon may be grown from a silicon substrate that is below the horizontal layers upwards through all of the horizontal layers. The mono-crystalline silicon completely fills the central portion of the channel hole, in one embodiment. Thus, there is no need for a core filler of, for example, silicon oxide.

As noted above in step 602, the sacrificial layers of, for example, silicon nitride can be replaced before or after forming the vertical NAND strings. Thus, in one embodiment, the vertical NAND strings are formed in alternating horizontal layers of silicon oxide and sacrificial silicon nitride. After the vertical NAND strings are formed, the sacrificial silicon nitride is replaced with metal or another conductor. In another embodiment, the vertical NAND strings are formed in alternating horizontal layers of silicon oxide and metal (or another conductor).

Figure 7:
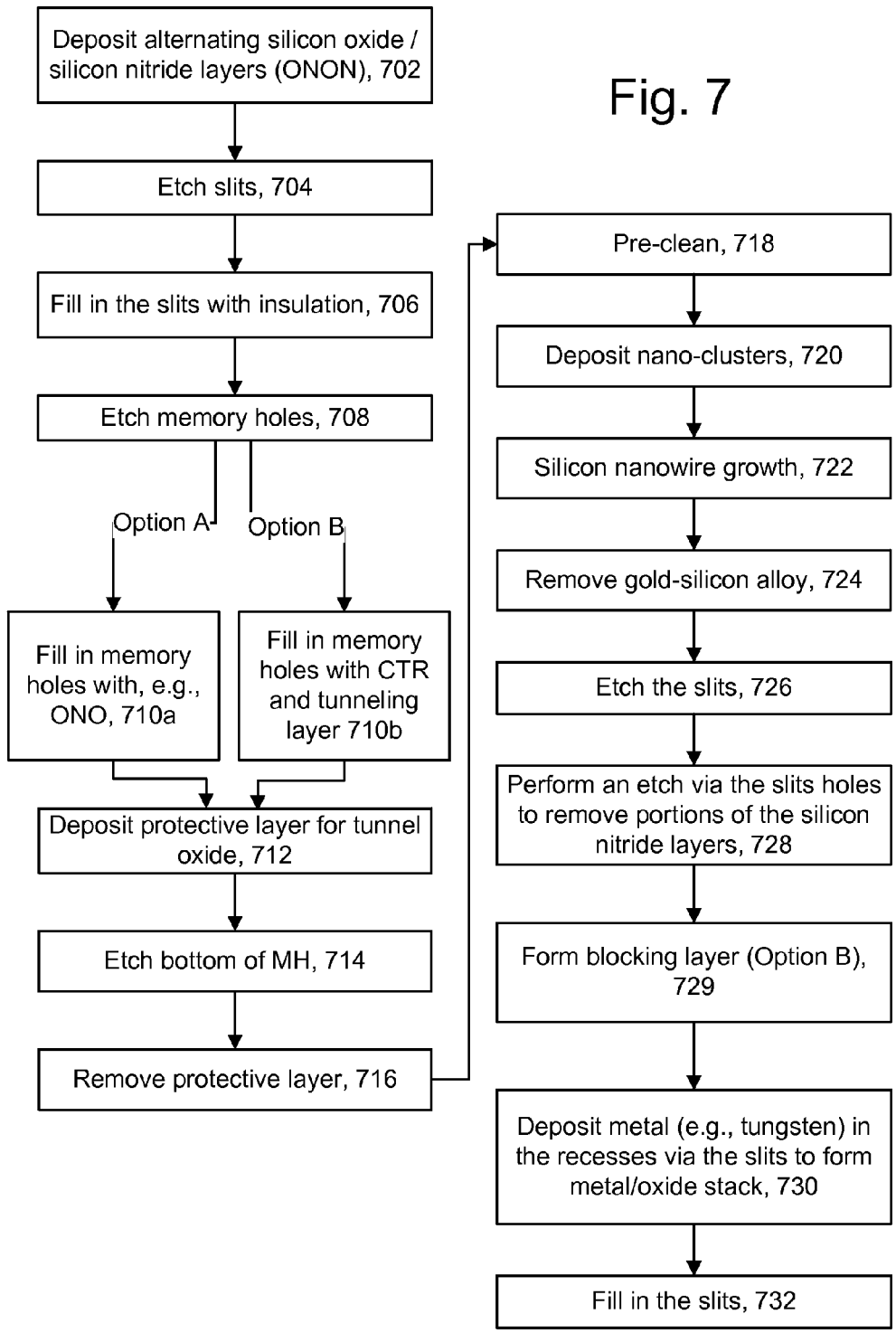
FIG. 7 is a flowchart of one embodiment of forming a 3D NAND memory having a mono-silicon crystalline vertical NAND channel formed by synthesizing a nanowire in a memory hole.

In one embodiment, the mono-silicon crystalline vertical NAND channel is formed by synthesizing a nanowire of mono-crystalline silicon in a memory hole from the substrate at the bottom of the vertically-oriented channel upwards to the top of the vertically-oriented channel. FIG. 7 is a flowchart of one embodiment of forming a 3D NAND memory having a mono-silicon crystalline vertical NAND channel formed by synthesizing a nanowire in a memory hole. FIG. 7 provides further details for one embodiment of FIG. 6. In FIG. 7, steps need not necessarily be performed as discrete steps in the order indicated. Various modifications can be made. Moreover, other steps which are known from the art of semiconductor fabrication but are not explicitly depicted here may also be performed. FIG. 7 represents a "word line last" technique in which the word lines are formed after forming the NAND strings. For example, after forming the NAND strings, sacrificial silicon nitride is replaced with metal as previously discussed.

Prior to this process, below-stack circuitry and metal layers may be formed on substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance.

Step 702 includes depositing alternating silicon oxide ($SiO_2$)/silicon nitride (SiN) layers above the substrate 201. The silicon nitride is a sacrificial layer, which will be replaced by metal to form word lines. The silicon oxide will be used for the insulating layers between the metal word lines. Other insulators could be used instead of silicon oxide. Other sacrificial materials could be used instead of silicon nitride. Step 702 is one embodiment of step 602 from FIG. 6, which is forming horizontal layers above a substrate.

Step 704 includes etching slits in the alternating silicon oxide ($SiO_2$)/silicon nitride (SiN) layers. Step 706 includes filling in the slits with insulation. FIGS. 4B and 4C show examples of slits 502 for straight NAND strings. FIG. 4A shows one example of slits 408 for U-shaped NAND strings.

Step 708 includes etching memory holes (MH) in the alternating layers of silicon nitride and silicon oxide. Reactive ion etching can be used to each the memory holes. In the memory array area, the memory holes are placed densely.

For example, the memory holes can have a width of 70-110 nanometers (nm) (70-110×10$^{-9}$ meters). This is an example range; other ranges could be used.

Figure 8A:
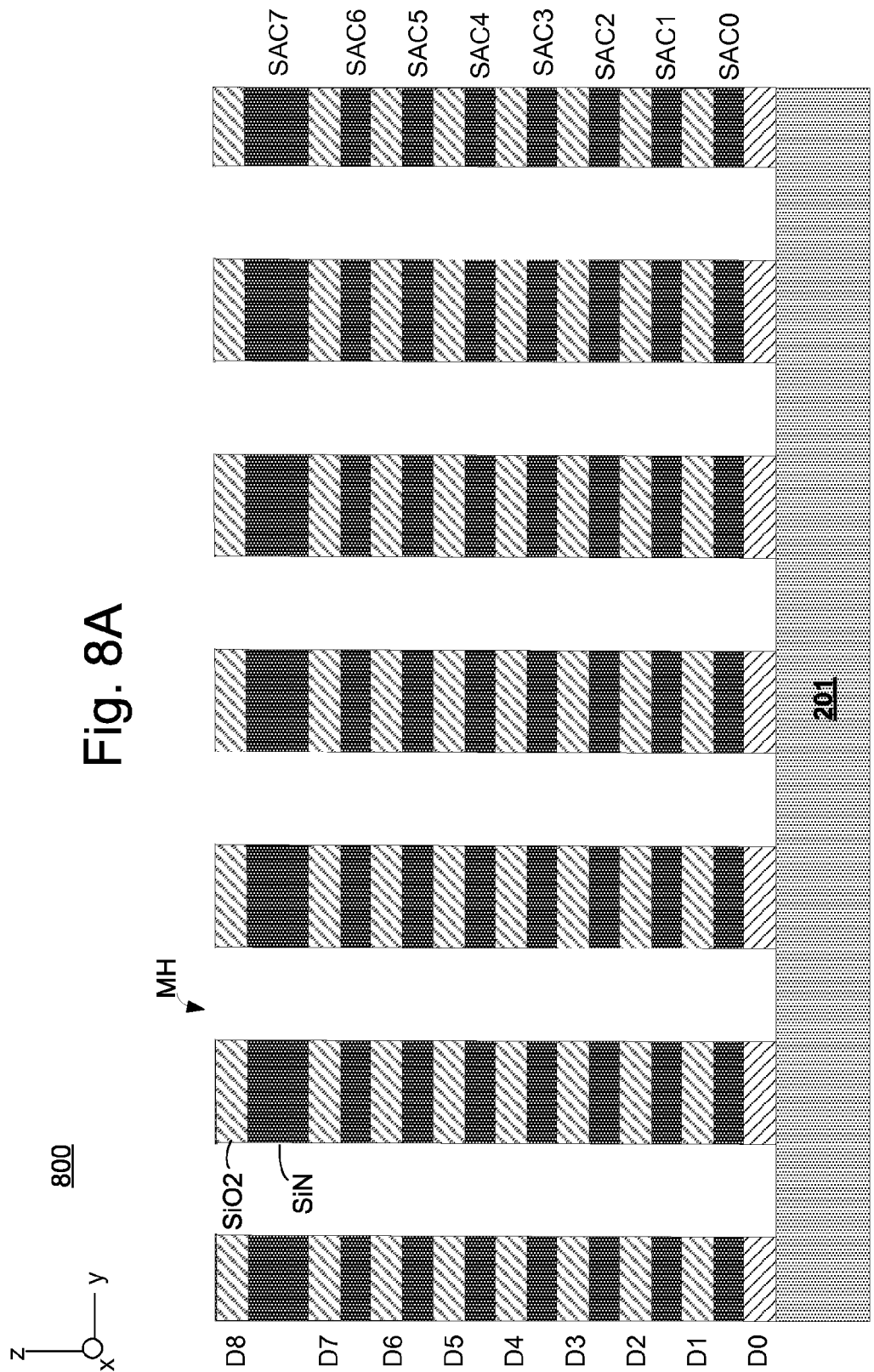
FIGS. 8A-8O show results after various points for the process of FIG. 7.

FIG. 8A shows results after step 708. FIG. 8A shows sacrificial layers (SAC0-SAC7) alternating with insulating layers (D0-D8) in a stack 800 over a substrate 201. The sacrificial layers are silicon nitride (SiN) in this embodiment and will eventually be layers SGS, WL0, WL1, WL2, WL3, WL4, WL5, and SGD. The insulating layers are silicon oxide in this embodiment. Six memory holes (MH) are depicted as extending vertically through the alternating sacrificial layers and insulating layers. The memory holes extend down to the substrate 201, which is formed from silicon in one embodiment. Etching the memory holes could etch partway into the substrate 201. An x-y-z coordinate system is depicted, showing that direction of formation. Step 708 is one embodiment of step 604 in FIG. 6.

Figure 8B:
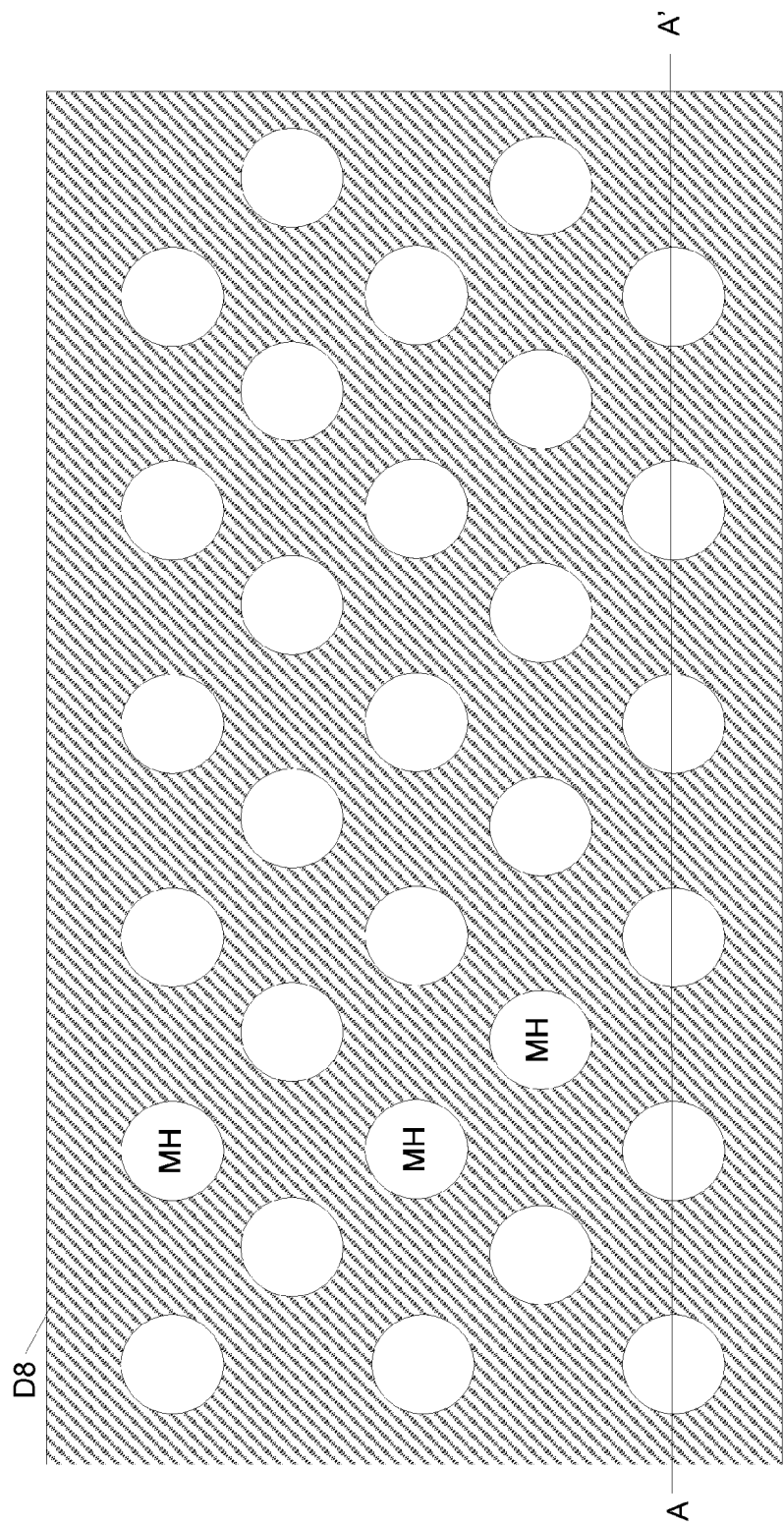

FIG. 8B shows a top view after step 708, showing one possible pattern for the memory holes (MH). This is not the only possible pattern. For example, the memory holes do not need to be staggered as depicted. An x-y-z coordinate system is depicted, showing that direction of formation. In this embodiment, the memory holes are staggered. Note that line A-A' indicates that FIG. 8A is a cross section along line A-A' of FIG. 8B. Also note that the memory holes have a circular cross section in the horizontal direction, in this example. The memory holes are not required to be circular. Note that the memory holes could be of different size in the different layers. For example, the memory holes could be smaller at the lower layers. The slits are not depicted in FIGS. 8A-8B so as to not obscure the diagrams.

Step 710a includes filling in memory holes with, for example, oxide-nitride-oxide (ONO). Step 710a is Option A. The following describes details of one embodiment of filling memory holes. In one approach, the memory holes are filled in by depositing ONO on sidewalls of the columnar memory holes, e.g., using ALD. In one embodiment, layers such as layers 296-298 are formed in the memory holes (see FIG. 5A-5C). A block oxide can be deposited as layer 296, a nitride such as SiN as a charge trapping layer can be deposited as layer 297, and a tunnel oxide can be deposited as layer 298. The ONO layers form a dielectric stack, in one embodiment. The stack layers can be more complex, such as where at least one of these layers can be a combination of layers of oxide and nitride. One example of ONO is SiO$_2$, SiN, SiO$_2$.

Step 710a is just one example of the initial filling of the memory holes with other alternatives existing. One option is to add an aluminum oxide layer first, prior to the ONO. Another option is for the tunnel oxide to comprise multiple layers, such as SiO$_2$ and SiON, with the SiO$_2$ nearest the charge trapping region (e.g., SiN). The tunnel oxide might also include SiO$_2$ and ISSG (in-situ steam generation) formed oxide, with the SiO$_2$ nearest the charge trapping region. The tunnel oxide might also include three layers: SiO$_2$, SiON, and ISSG formed oxide. Thus, the layers from outside in could comprise: Al$_2$O$_3$, SiO$_2$, SiN, SiO$_2$, SiON, ISSG oxide.

The thickness of the material for the memory cells formed in step 710 may be about 22 nm (22×10$^{-9}$ meters). Assuming an initial memory hole diameter of 70 to 110 nm (70 to 110×10$^{-9}$ meters), this leaves 26 to 66 nm (26 to 66×10$^{-9}$ meters) to be filled with the silicon nanowire. These parameters are just examples for the sake of illustration. Other thicknesses can be used. Step 710a is one embodiment of step 606a (forming material for memory cells in a memory hole, leaving a channel hole).

In one embodiment, the blocking layer is not deposited in step 710a, but is formed later. Step 710b is for an Option B, in which the blocking layer is formed later (see optional step 729). In step 710b, first a layer of ISSG generated oxide is formed in the memory holes. This could be about 5 to 6 nm (5 to 6×10$^9$ meters). Then, the charge trapping layer and tunneling layer are deposited in the memory holes. The charge trapping layer and tunneling layer may be deposited as described in step 710a. The ISSG generated oxide serves as a protective layer for the tunnel oxide during later processing steps. Step 710b is one embodiment of step 606a (forming material for memory cells in a memory hole, leaving a channel hole).

Figure 8D:
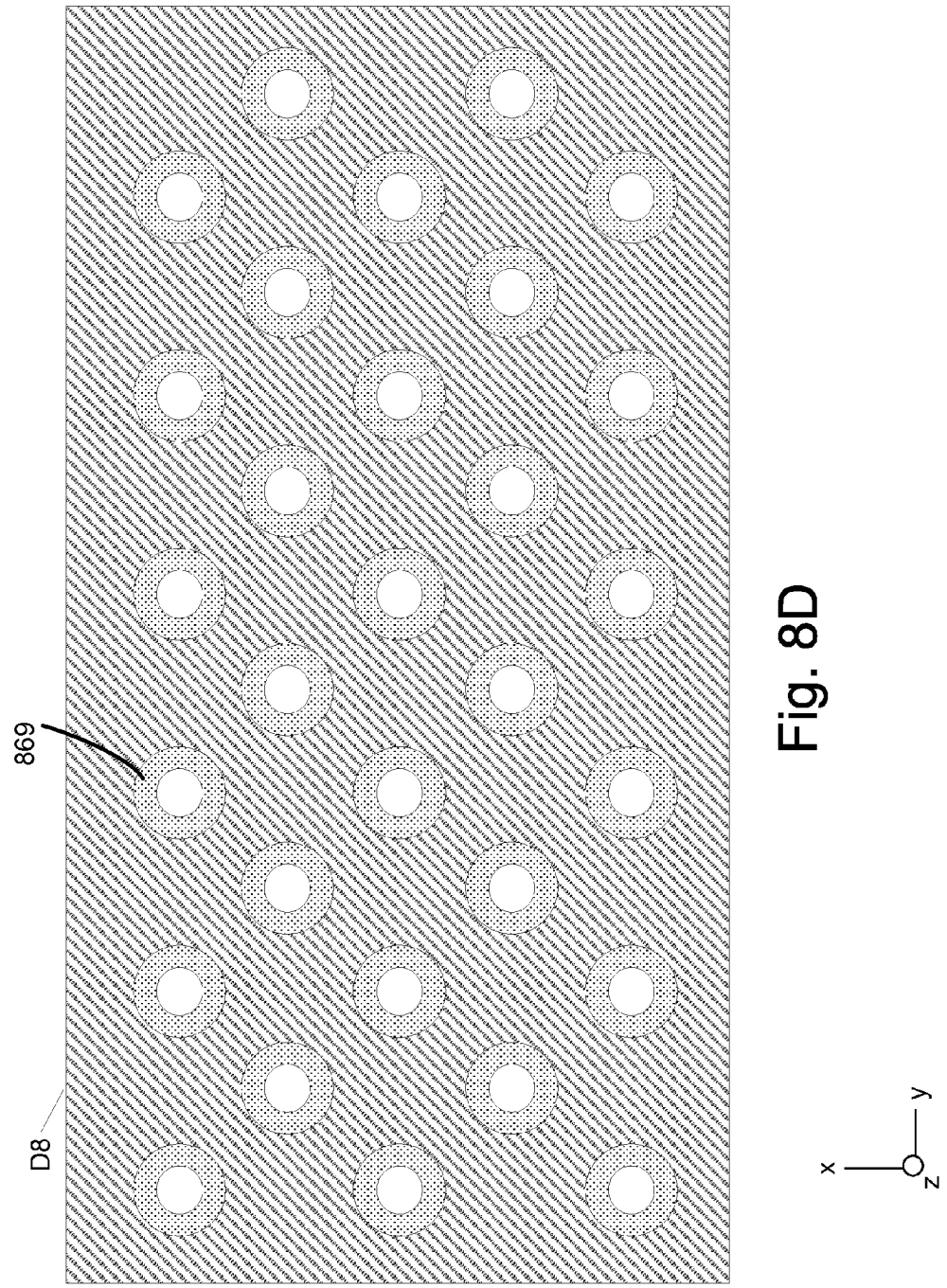

FIG. 8C shows results after step 710a. Blocking layer 696, charge trapping layer 697 and tunnel oxide layer 698 of FIGS. 5A-5C are represented in FIG. 8C by region 869. As noted in step 710b, instead the layers in FIG. 8C could be ISSG generated oxide, charge trapping layer 697 and tunnel oxide layer 698. Other possibilities exist. FIG. 8D shows a top view (horizontal cross section of layer D8) after step 710a, showing region 869 in the memory holes (MH). Region 869 is a hollow cylinder, in this example.

Step 712 is forming a protective layer over the tunnel oxide. The protective layer serves to protect the tunnel oxide when the bottom of the memory hole is etched. One example for the protective layer is amorphous silicon. Amorphous silicon has a high etch selectivity with respect to both SiON, as well as ISSG formed oxide. A material other than amorphous silicon could be used for the protective layer. Another example for the protective layer is LTO (low temperature oxide). The protective layer should have a high etch selectivity with respect to the outermost layer of the tunnel oxide.

Figure 8E:
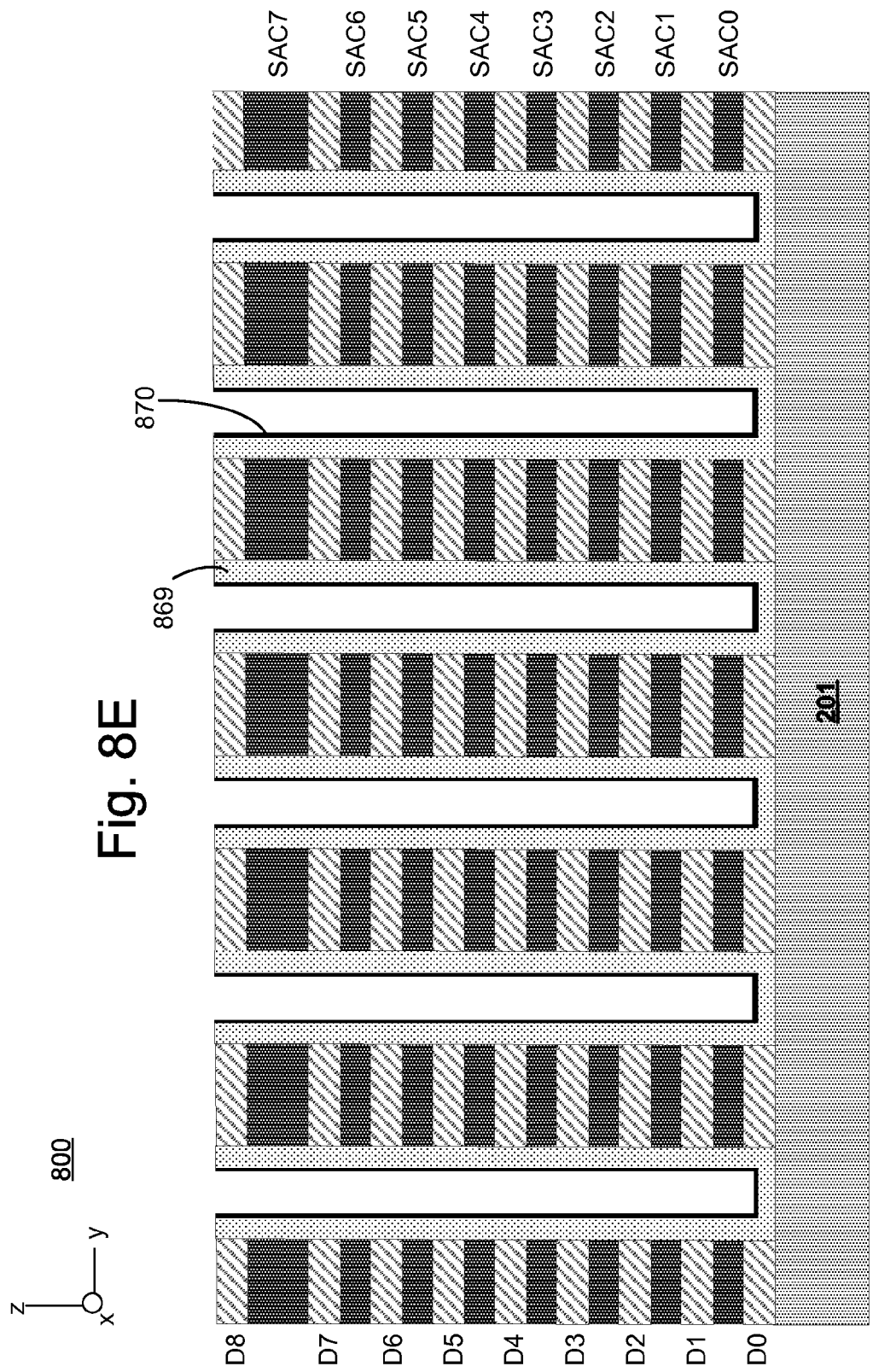

FIG. 8E shows results after step 712. This Figure show the protective layer 870 over region 869. The protective layer 870 is amorphous silicon in one embodiment. Recall that the outermost portion of region 869 is the tunnel oxide. As stated, the outermost portion of the tunnel oxide (in the direction from control gate toward the central axis of symmetry of memory hole) could be SiON or ISSG generated oxide, as two examples. The outermost portion of the tunnel oxide could also be SiO$_2$, with a suitable choice for the protective layer 870.

Figure 8F:
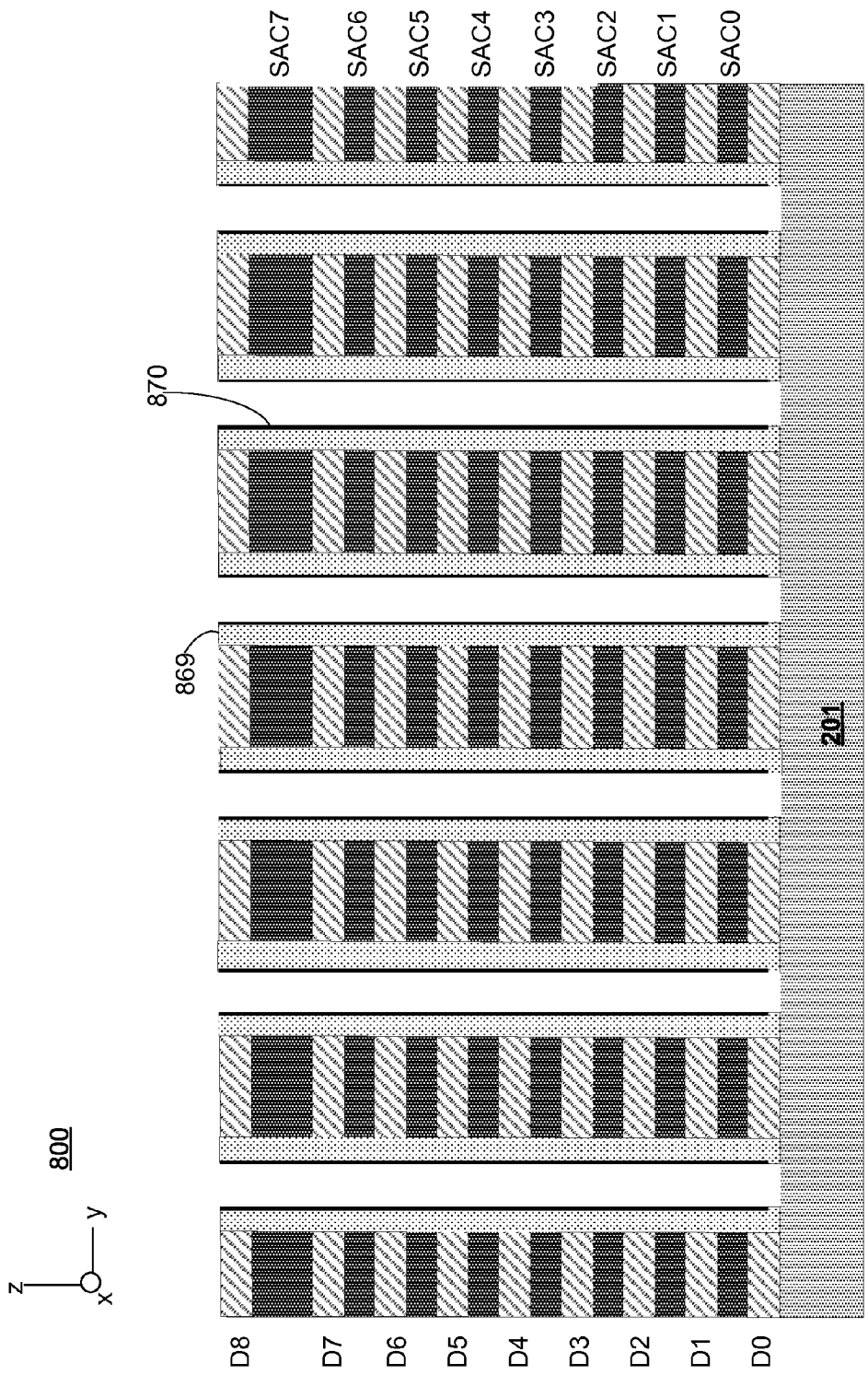

Step 714 is etching of the bottom of the memory holes with the protective layer 870 in place over the tunnel oxide on the vertical sidewalls. FIG. 8F shows results after step 714, showing that the memory holes have been etched down to the substrate 201. The etching has gone through the protective layer 870 at the bottom of the memory holes, and through the horizontal portion of the memory layer (e.g., ONO) 869 at the bottom of the memory holes. However, the protective layer 870 remains largely in place over the vertical sidewalls of region 869 in the memory holes, protecting layer 869 on the vertical sidewalls. Thus, the tunnel oxide is protected. The etching also goes through region 869 at the bottom of the memory holes.

Step 716 is the removal of the protective layer 870. In one embodiment, a wet etch is used to remove the amorphous silicon protective layer. As noted, the protective layer does not have to be amorphous silicon. Steps 710-716 are one embodiment of step 606a from FIG. 6, which is forming material for memory cells in the memory holes, leaving a channel hole.

Step 718 is a pre-cleaning step that precedes forming the mono-crystalline silicon NAND channel. Step 718 is optional. In one embodiment, step 718 uses a dry etch process. The dry etch may be a remote plasma assisted dry etch process that involves simultaneous exposure to H$_2$, NF$_3$ and NH$_3$ plasma by-products. Remote plasma excitation of hydrogen and fluorine species allows plasma-damage-free substrate processing. The dry etch may be largely conformal and selective towards silicon oxide layers but does not readily etch silicon regardless of whether silicon is amorphous, crystalline or polycrystalline. One example of a dry etch that may be used in step 718 is described in U.S. Pat. No. 8,501,629.

Steps 720-724 describe forming mono-crystalline silicon nanowires in channel holes using vapor-liquid-solid (VLS) synthesis to grow the mono-crystalline silicon from the substrate at the bottom of the vertically-oriented channel upwards to the top of the vertically-oriented channel. This technique uses a catalyst, which in one embodiment is gold nano-clusters. Note that since the channel holes were formed by depositing material in the memory holes, these steps 720-724 can be described as forming mono-crystalline silicon nanowires in the memory holes.

Step 720 is depositing nano-clusters in the channel holes. The nano-clusters serve as a catalyst for growth of mono-crystalline silicon. The nano-clusters are gold, in one embodiment. Nano-clusters may constitute an intermediate state of matter between molecules and solids. Nanoscale gold clusters may exhibit catalytic activity. The gold nano-clusters are deposited as a thin film between about 1 to 10 nanometers ($1 \times 10^{-9}$ meters to $10 \times 10^{-9}$ meters) in one embodiment. However, the film could be thicker or thinner.

In one embodiment, gold nano-clusters are deposited in colloidal form in the channel hole. Colloidal gold is a suspension (or colloid) of submicron-size nanoparticles of pure gold suspended in a fluid, e.g. water or other liquids. In one embodiment, the water is pure deionized water. The gold nanoparticles may be a few nanometers to several tens of nanometer in diameter, as one example range. An atom of gold is about 0.288 nanometers in diameter, so the gold nanoparticles may be only about 10 times, to several hundred times the diameter of a single gold atom. These particles stay suspended in pure deionized water and do not fall to the bottom. It is these suspended particles that make it a colloid.

In one embodiment, gold nano-clusters are self-assembled in the channel hole during a deposition or sputtering process. Thus, the gold nano-clusters are three dimensionally grown gold nano-particles, in one embodiment. A memory hole mask can be used during this deposition process to control the location of gold nano-cluster formation.

In one embodiment, gold nano-clusters are formed in the channel hole by thin film dewetting. Dewetting is one of the processes that can occur at an interface. Generally, dewetting describes the rupture of a thin liquid film on the substrate (either a liquid itself, or a solid) and the formation of droplets, or nano particles. Initially a very thin gold film is deposited on the substrate and then, dewetting is performed to form gold nano-particles three dimensionally.

Figure 8G:
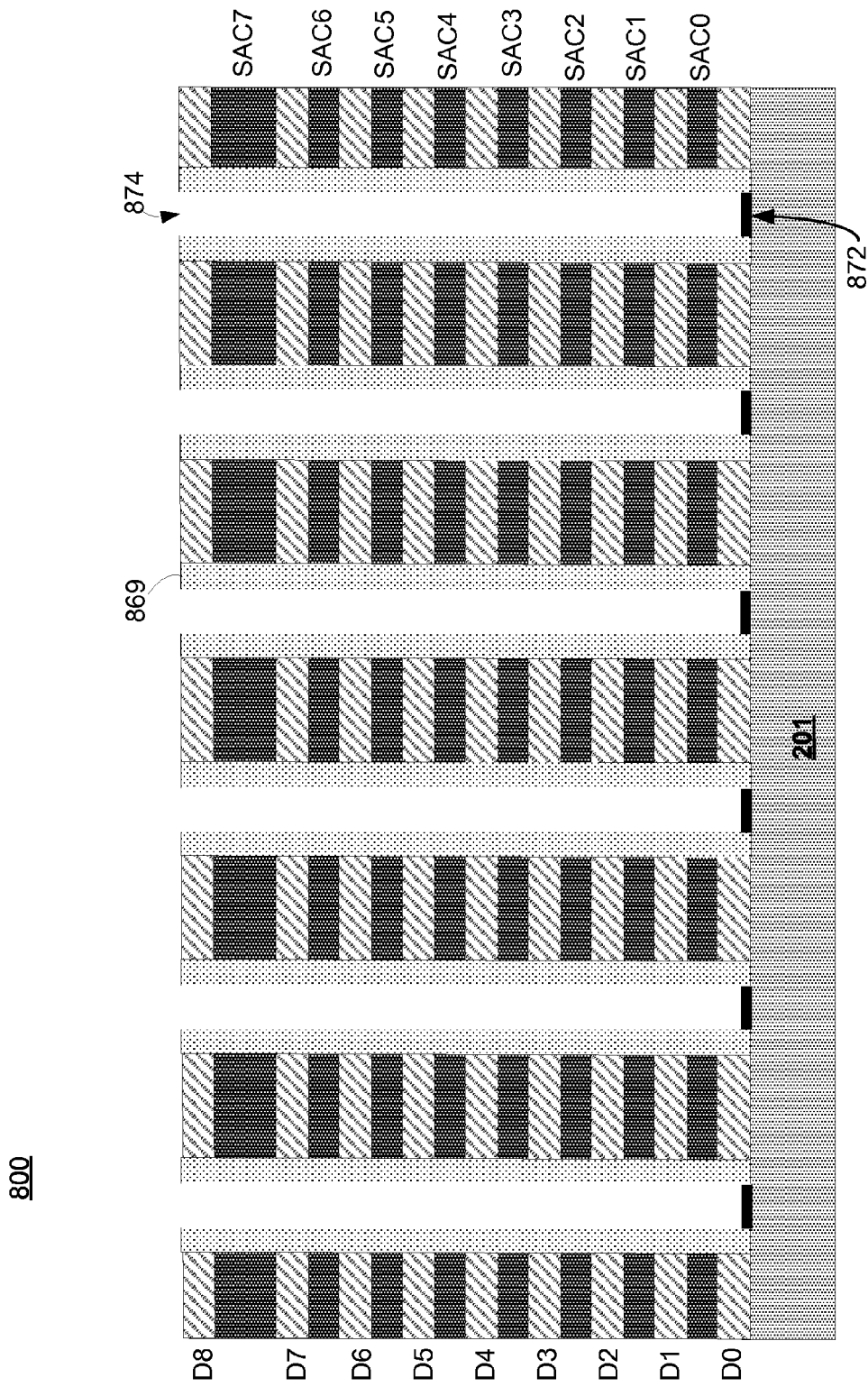

FIG. 8G show results after step 720. FIG. 8G shows gold nano-clusters 872 at the bottom of the channel holes 874. The gold nano-clusters 872 are formed directly on the silicon substrate 201 in this embodiment.

Step 722 is mono-crystalline silicon nano-wire growth. Step 722 includes annealing at temperatures higher than the gold-silicon eutectic point. This may create gold-silicon alloy droplets on the substrate surface. The thicker the film of gold nano-clusters, the thicker the gold-silicon alloy droplets will be. Mixing gold with silicon greatly reduces the melting temperature of the alloy as compared to the alloy constituents. The melting temperature of the gold:silicon alloy reaches a minimum (~363° C.) when the ratio of its constituents is 4:1 gold:silicon, also known as the gold:silicon eutectic point.

Step 722 also includes introducing a reactant source to the memory holes (which at this point in the process are now described as channel holes). In one embodiment, the reactant source is disilane ($Si_2H_6$). Disilane may be expected to have a higher catalytic decomposition rate versus SiH$_4$ due to a lower activation energy for cleavage of Si—Si versus Si—H. In one example, silicon nanowires are synthesized at 380-450° C. using gold nano-clusters as catalysts and $Si_2H_6$ as reactant source. The gas flow rate for $Si_2H_6$ may be about 3 standard cubic centimeters per minute (sccm).

Gold particles can form gold-silicon eutectic droplets at temperatures above 363° C. and adsorb silicon from the vapor state (because gold can form a solid-solution with all silicon concentrations up to 100%) until reaching a super-saturated state of silicon in gold. Furthermore, nano-sized gold-silicon droplets have much lower melting points because the surface area-to-volume ratio is increasing, becoming energetically unfavorable, and nanometer-sized particles act to minimize their surface energy by forming droplets (spheres or half-spheres).

Silicon has a much higher melting point (~1414° C.) than that of the eutectic alloy. Therefore, silicon atoms precipitate out of the supersaturated liquid-alloy droplet at the liquid-alloy/solid-silicon interface, and the droplet rises from the surface. Overall growth process can be broken down into contributions from (i) catalytic adsorption of gaseous reactants at the surface of liquid gold nanoparticles, (ii) diffusion of silicon through the liquid gold-silicon alloy to a sink, and (iii) crystallization at liquid-solid interface This process is illustrated in FIGS. 8H-8L.

Figure 8H:
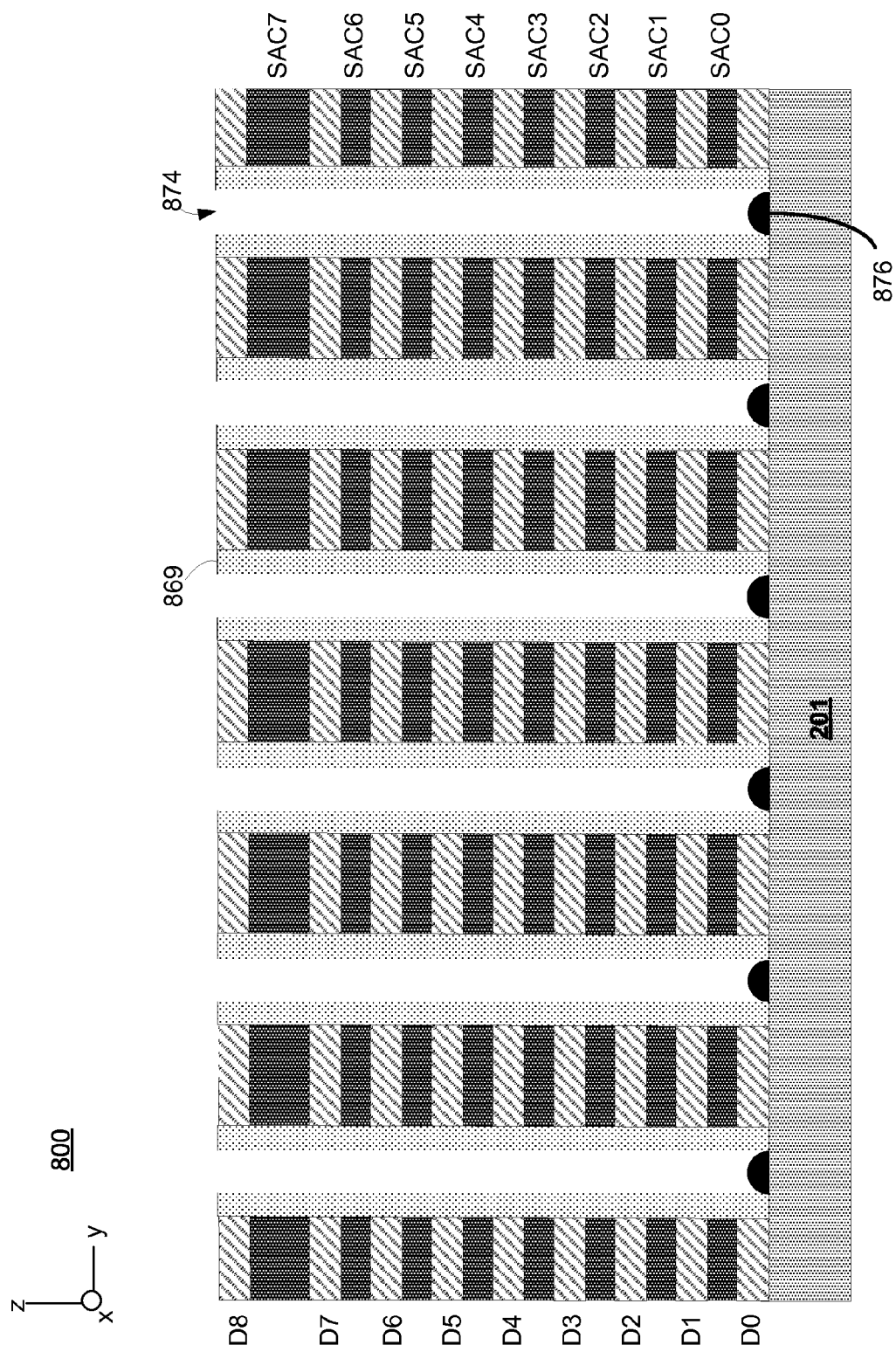
Figure 8M:
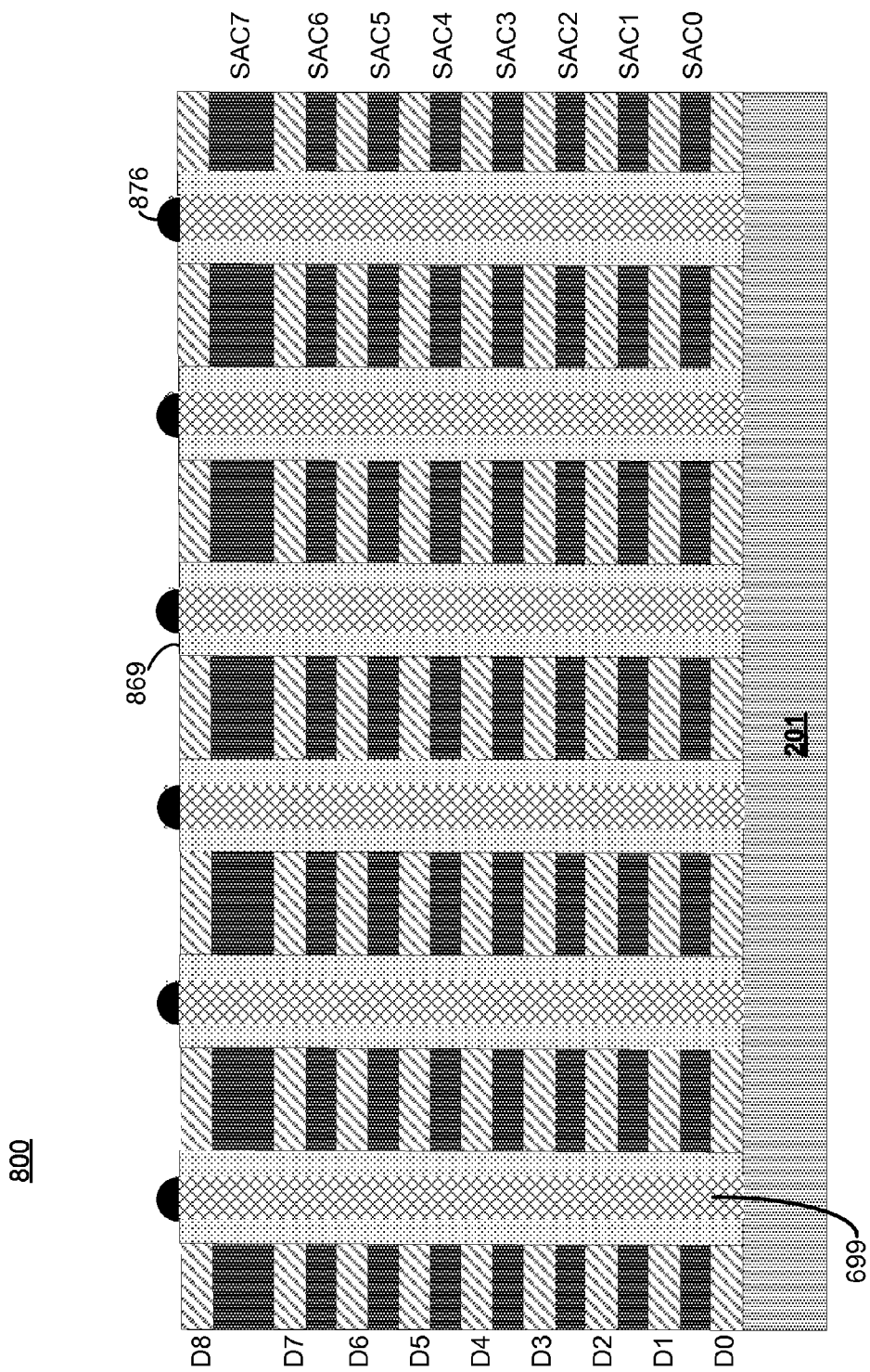

FIG. 8H shows gold-silver alloy droplets 876 at the bottom of the channel holes 874. The gold-silver alloy droplets 876 are formed directly on the silicon substrate 201 in this embodiment. FIGS. 8I-8L are diagrams of one channel hole 874 during formation of the mono-crystalline silicon nanowire. FIG. 8I is similar in stage of development as FIG. 8H, showing a gold-silver alloy droplet 876 at the bottom of the channel hole 874. FIG. 8J shows that the mono-crystalline silicon nanowire 878 has begun to grow upward from the bottom of the channel hole 874. The gold-silver alloy droplet 876 is on top of the mono-crystalline silicon nanowire 878. FIG. 8K shows further development of the mono-crystalline silicon nanowire 878, showing additional upwards growth. Again, the gold-silver alloy droplet 876 is on top of the mono-crystalline silicon nanowire 878. FIG. 8L shows final development of the mono-crystalline silicon nanowire 878, showing that the mono-crystalline silicon nanowire 878 completely fills the channel hole 874 from bottom to top. Again, the gold-silver alloy droplet 876 is on top of the mono-crystalline silicon nanowire 878. Note that the gold-silver alloy droplet 876 is now outside of the channel hole 874. FIG. 8M shows a similar stage of development for several NAND channels. The mono-crystalline silicon nanowire now forms the NAND string channel 699. In one embodiment, a single mono-crystalline silicon nanowire forms entire the NAND string channel 699.

Step 724 is to remove the gold-silicon alloy at the tops of the NAND string channel 699. In one embodiment, gold-silicon droplets (alloy) can be etched by Potassium Iodide (KI) solution. The solution may include Potassium Iodide (KI), Iodine ($I_2$), and deionized water. An example of an etching solution is: (KI:$I_2$:$H_2O$=4 g:1 g:40 ml). Other etching compositions can be used.

Steps 720-724 are one embodiment of step 606b from FIG. 6, which is forming a vertically oriented NAND string channel from mono-crystalline silicon upwards in the channel hole.

Step 726 is to etch the slits. This removes the material that was in the slits and is done to allow removal of the sacrificial silicon nitride and to deposit metal. Note that rather than using slits, some other type of etching can be done, such as etching holes, voids, etc.

Step 728 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

The ISSG generated oxide that was optionally formed in the memory holes in step 710b serves to protect the charge trapping layer during one embodiment of the etch of step 728. After removing the silicon nitride, the ISSG generated oxide is fully or partially removed. A cleaning step may then be performed.

In step 729 (Option B), a blocking layer is formed. The blocking layer is an $SiO_2$ layer and an $AlO_3$ layer (with the $SiO_2$ layer closer to the charge storage region), in one embodiment. Note that in Option A, the blocking layer was formed earlier in step 710a. The blocking layer may be deposited by ALD from outside of the memory hole through the slits.

Step 730 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Figure 8N:
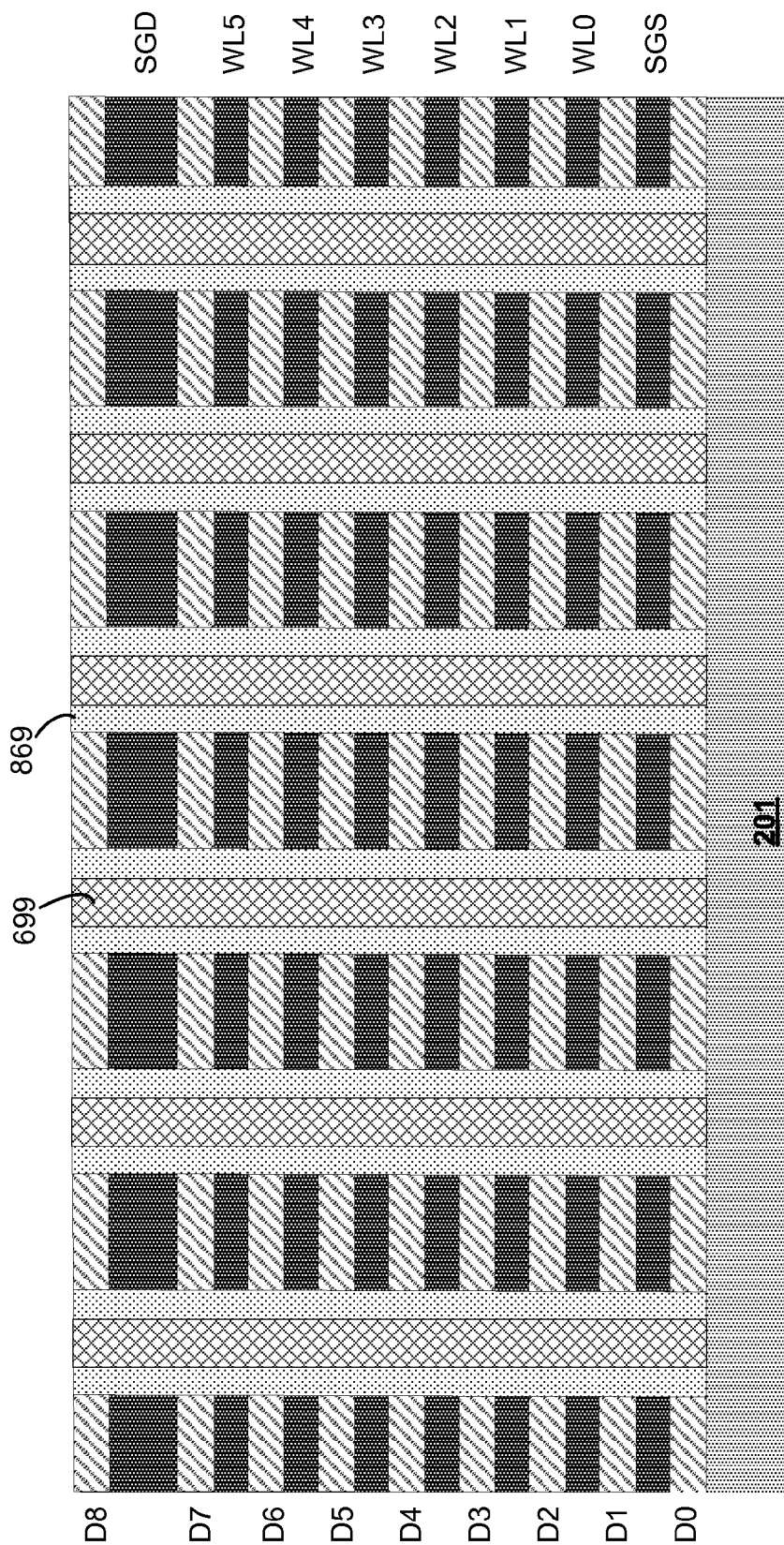
Figure 8O:
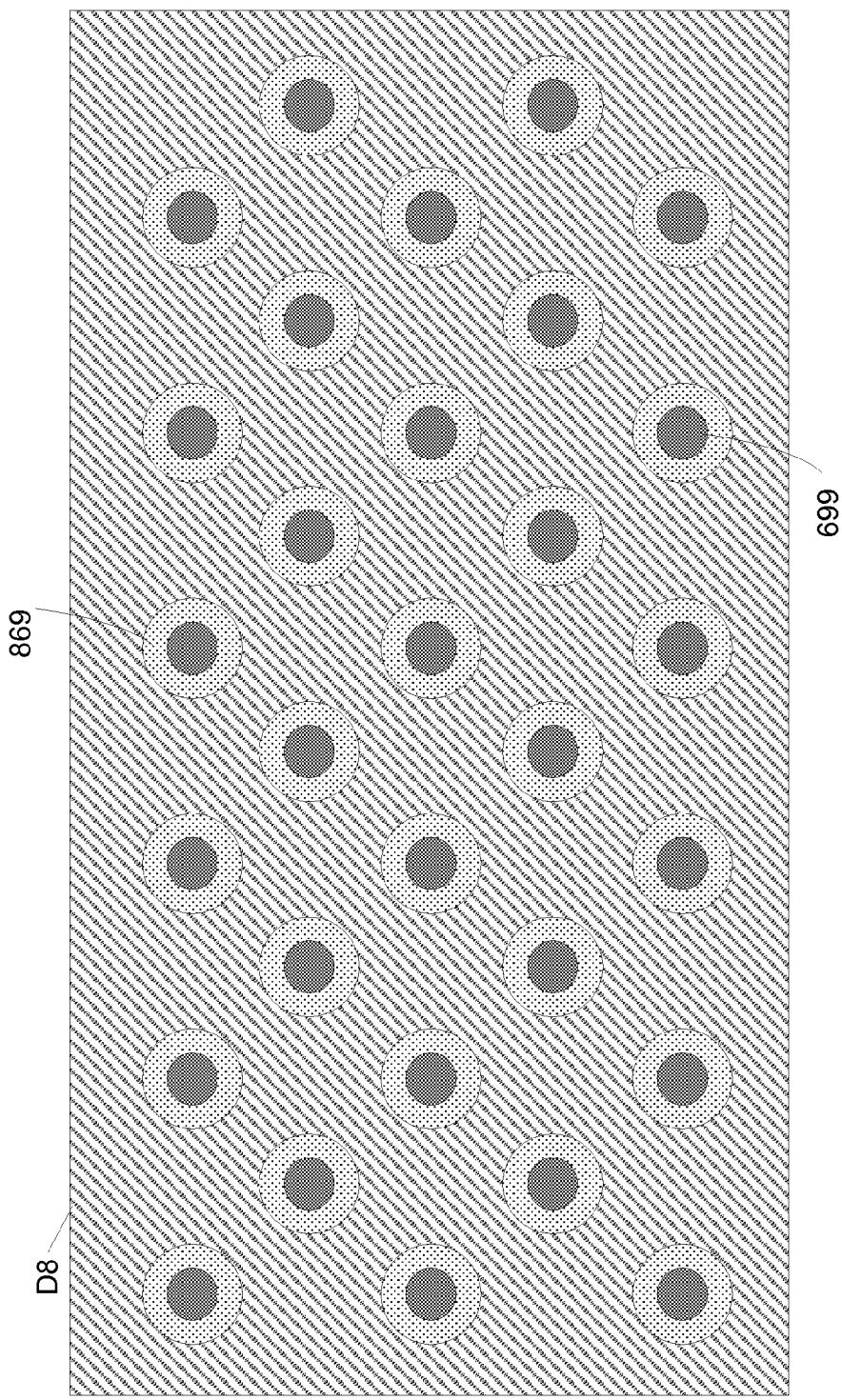

Step 732 is re-filling in the slits. FIGS. 8N and 8O show results after step 732. The sacrificial layers SAC0-SAC7 have been replaced by layers SGS, WL0-WL5, and SGD, respectively. Also, the gold-silicon alloy has been removed. The mono-crystalline silicon NAND string channel 699 has a solid (e.g., not hollow) pillar shape in this embodiment. Afterwards, drain diffusion regions 892, bit line contacts 811, and bit lines 111 may be formed.

As noted above, a number of different sequences can be used to for the 3D memory array having the NAND channel with mono-crystalline silicon. Instead of forming the metal layers last, the metal layers could be formed prior to forming the NAND string. In this case, either the memory holes or the slits can be used to etch away the sacrificial layer. Likewise, the metal for the metal layers can be deposited through either the memory holes or the slits.

In one embodiment, the mono-silicon crystalline vertical NAND channel 699 is formed using vapor phase epitaxial growth to grow the mono-crystalline silicon from the bottom of the vertically-oriented channel upwards to the top of the vertically-oriented channel. In one embodiment, the substrate 201 is a p-type substrate. In one embodiment, the substrate 201 is an n-type substrate.

Figure 9:
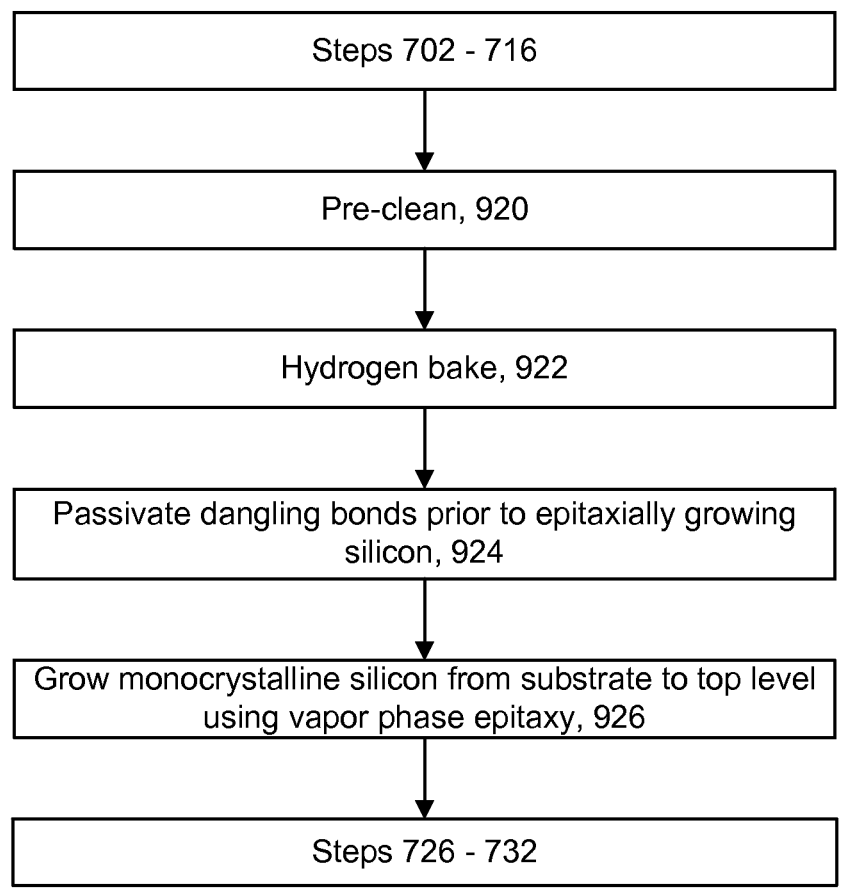
FIG. 9 is a flowchart of one embodiment of forming a 3D NAND memory having a mono-silicon crystalline vertical NAND channel formed using vapor phase epitaxial growth.

FIG. 9 is a flowchart of one embodiment of forming a 3D NAND memory having a mono-silicon crystalline vertical NAND channel formed using vapor phase epitaxial growth. The process has some common steps with the process of FIG. 7. Initially, steps 702-716 are performed as previously discussed. Recall that these steps formed memory holes in alternating layers of silicon oxide and sacrificial silicon nitride. Then, memory cell material was formed in the memory holes, leaving channel holes. Also, the bottom of the memory holes were etched such that the substrate is exposed at the bottom of the channel hole.

The following are example materials and thicknesses for one embodiment of the memory cell material. The outermost layer is $Al_2O_3$ (which may be deposited using ALD) having a thickness of 4 nm to 6 nm ($4\times10^{-9}$ to $6\times10^{-9}$ meters). Next, towards the memory hole center is an $SiO_2$ layer having a thickness of 4 nm to 6 nm ($4\times10^{-9}$ to $6\times10^{-9}$ meters). Together, the $Al_2O_3$ and the $SiO_2$ forms a blocking layer 696, in one embodiment. Next is a SiN charge trapping layer 697 having a thickness of about 5 nm ($5\times10^{-9}$ meters). Next is the tunnel oxide layer 698, which might include three layers: $SiO_2$, SiON, and ISSG formed silicon oxide. These tunnel oxide layers could each be about 2 nm to 3 nm (2 to $3\times10^{-9}$ meters), and could each be of different thicknesses. Other materials can be used for the memory cell material. Also other thicknesses can be used for the memory cell material. Also, as described in Option B of FIG. 7, one option is to form the blocking layer by deposition through the slits later in the process (see step 729 of FIG. 7).

Steps 920-926 are one embodiment of step 606b from FIG. 6. Step 920 is pre-cleaning prior to epitaxial growth. A chemical mixture of sulfuric acid and hydrogen peroxide may be used. This may be followed by a dilute hydrofluoric acid (HF) dip. The HF dip may be for about two minutes.

Next, in step 922, a bake in hydrogen may be performed. This bake may be at about 900 degrees Celsius and may be for about two minutes. The hydrogen bake can be used to remove any residual oxygen and/or carbon on the surface of the substrate 201. As one example, the hydrogen gas flow rate is about 10 to 50 sccm. As one example, the pressure may be about 5 torr.

Step 924 is an optional step of passivating dangling silicon bonds prior to growing the mono-crystalline silicon using vapor phase epitaxy. This step helps to mitigate unintentional nucleation sites. Step 924 includes using nitrogen to passivate dangling silicon bonds in one embodiment. Example parameters are a nitrogen gas flow rate of 10 to 50 sccm, a pressure of 10 to 30 mTorr, and a time of about 10 to 150 seconds. Other parameters could be used.

Dangling silicon bonds are discussed more fully below. Briefly, the vertical sidewalls of the channel holes may have unintentional nucleation sites. The unintentional nucleation sites may be dangling silicon bonds. Passivating the dangling silicon bonds helps to prevent unintentional growth of silicon on the vertical sidewalls of the channel holes. Such growth could potentially block the channel hole, thereby preventing formation of mono-crystalline silicon in the entire NAND string channel.

Step 926 is to grow mono-crystalline silicon from the substrate upwards through all of the layers of silicon oxide and silicon nitride using vapor phase epitaxy. The length of time can vary as needed to grow the mono-crystalline silicon to the tops of the channel holes. An example range of temperatures is 600 to 650 degrees Celsius. However, higher or lower temperatures can be used. The growth rate may increase with temperature. The entire growth process may be carried out using Chemical Vapor Deposition (CVD). Note that this is vapor phase epitaxy. Vapor phase epitaxy may provide for much faster growth rates than solid phase epitaxy.

Intentional doping of the NAND channel is not required, but could be performed. If the NAND channel is not intentionally doped, background doping levels below $5 \times 10^{16}$ cm$^{-3}$ may result for both boron and phosphorous. This is just an example, the background doping level could be different from the example.

In one embodiment, neopentosilane (NPS) $Si_5H_{12}$ is used as precursor. Use of NPS as a precursor can significantly speed up the growth of mono-crystalline silicon in the channel holes. A high growth rate makes is economically feasible to grow mono-crystalline silicon vertical NAND channels that are very long. As one example, mono-crystalline silicon vertical NAND channels that are 4 to 5 micrometers ($4 \times 10^{-6}$ meters to $5 \times 10^{-6}$ meters) in vertical length can be grown in short time, providing for a cost effective growth mechanism. Also, mono-crystalline silicon vertical NAND channels having a high aspect ratio can be grown in a cost effective manner. Likewise, relatively long (e.g., $4 \times 10^{-6}$ meters to $5 \times 10^{-6}$ meters) mono-crystalline silicon vertical NAND channels having a high aspect ratio and can be grown in a cost effective manner.

Note that a precursor other than NPS could be used. For example, precursors such as dichlorosilane (DCS) and HCl might be used. When using such precursors, the deposition conditions may be different than when using NPS. The deposition conditions may need to be better optimized when DCS and HCl are used. The gas flow rates may be 50 to 150 sccm for HCl and 100 to 400 sccm for DCS. An example pressure is about 10 to 30 mTorr. An example range of temperatures is 750 to 850 degrees Celsius. However, higher or lower temperatures can be used. The growth rate may increase with temperature.

In one embodiment, the mono-crystalline silicon vertical NAND channel has a (100) orientation from the bottom to the top of the channel hole. An orientation of (100) may provide for better electron mobility than other orientations.

After forming the mono-crystalline silicon, steps 726-732 from FIG. 7 may be performed. Recall that these steps replaced the sacrificial silicon nitride with metal. Results after the process of FIG. 9 may be similar to those depicted in FIGS. 8N and 8O.

In one embodiment, unintentional nucleation sites on sidewalls of memory holes are passivated. FIGS. 10A-10D depicts clogging of memory holes that could occur due to unintentional nucleation sites on sidewalls of memory holes. This problem could occur when forming mono-crystalline silicon that extends the entire vertical length of the NAND channel. However, the problem could occur when forming mono-crystalline silicon that extends only to one of the lower horizontal layers.

Figure 10A:
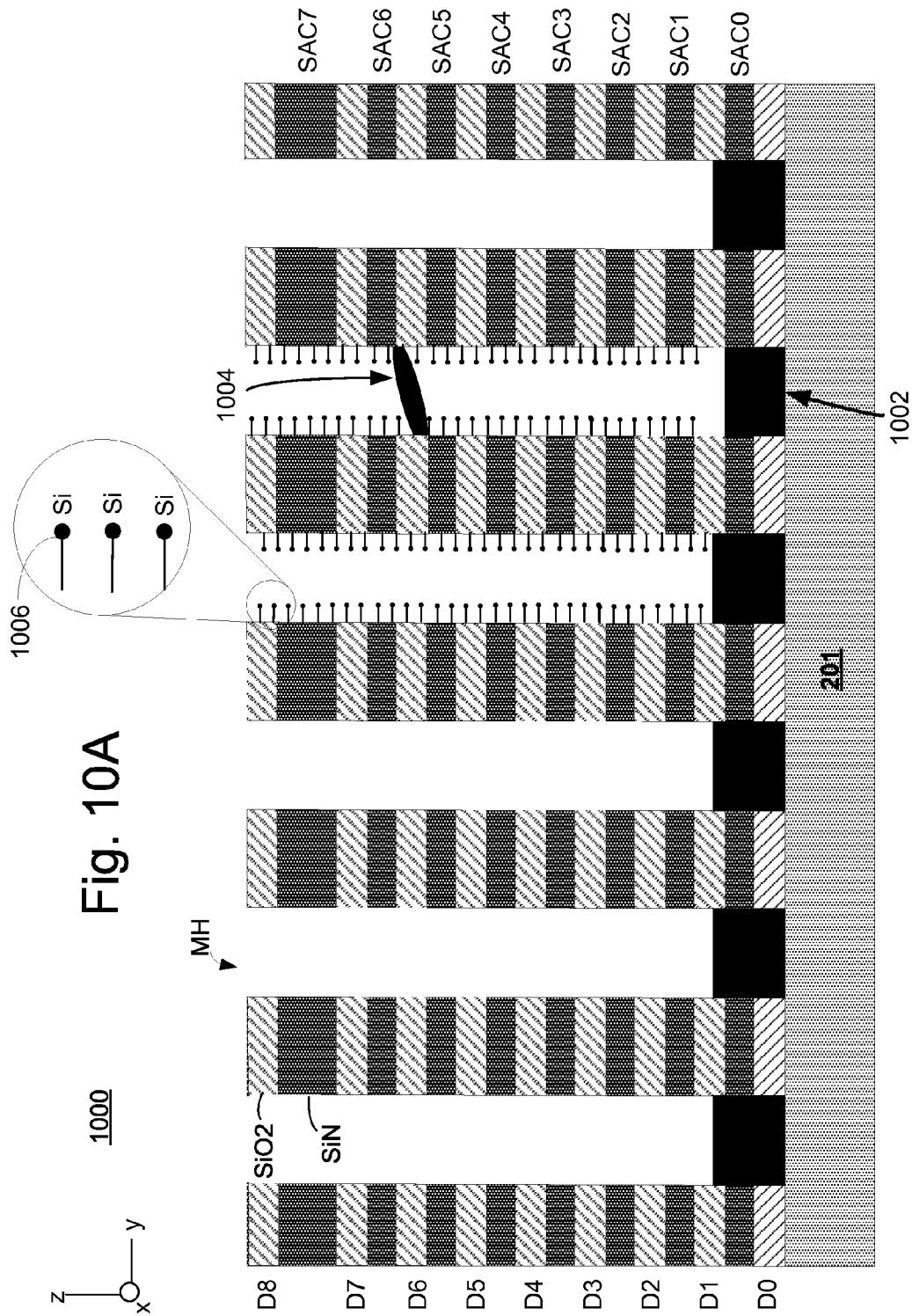

FIG. 10A shows formation of mono-crystalline silicon 1002 in just the bottom portion of the memory holes (MH). In this example, horizontal layers D0-D8 in the stack 1000 may be silicon oxide. Horizontal layers SAC0-SAC7 may be silicon nitride. The vertical sidewalls of the memory holes have unintentional nucleation sites 1006. A number of such unintentional nucleation sites 1006 have been represented on the vertical sidewalls of two of the memory holes. The unintentional nucleation sites 1006 may be a dangling silicon bond.

So as to not obscure the diagram, nucleation sites are not represented in other memory holes. The nucleation sites 1006 can be present during epitaxial silicon growth. Silicon nucleation sites 1006 could be present at the silicon oxide interface, as one possibility. Additionally, silicon nucleation sites 1006 could be present at the silicon nitride interface, as another possibility. During epitaxial silicon growth 1002 at the bottom of the memory hole, there could be un-intended epitaxial silicon growth at the nucleation sites 1006 on the vertical sidewalls. One of the memory holes is clogged with unintentional silicon growth 1004.

Figure 10B:
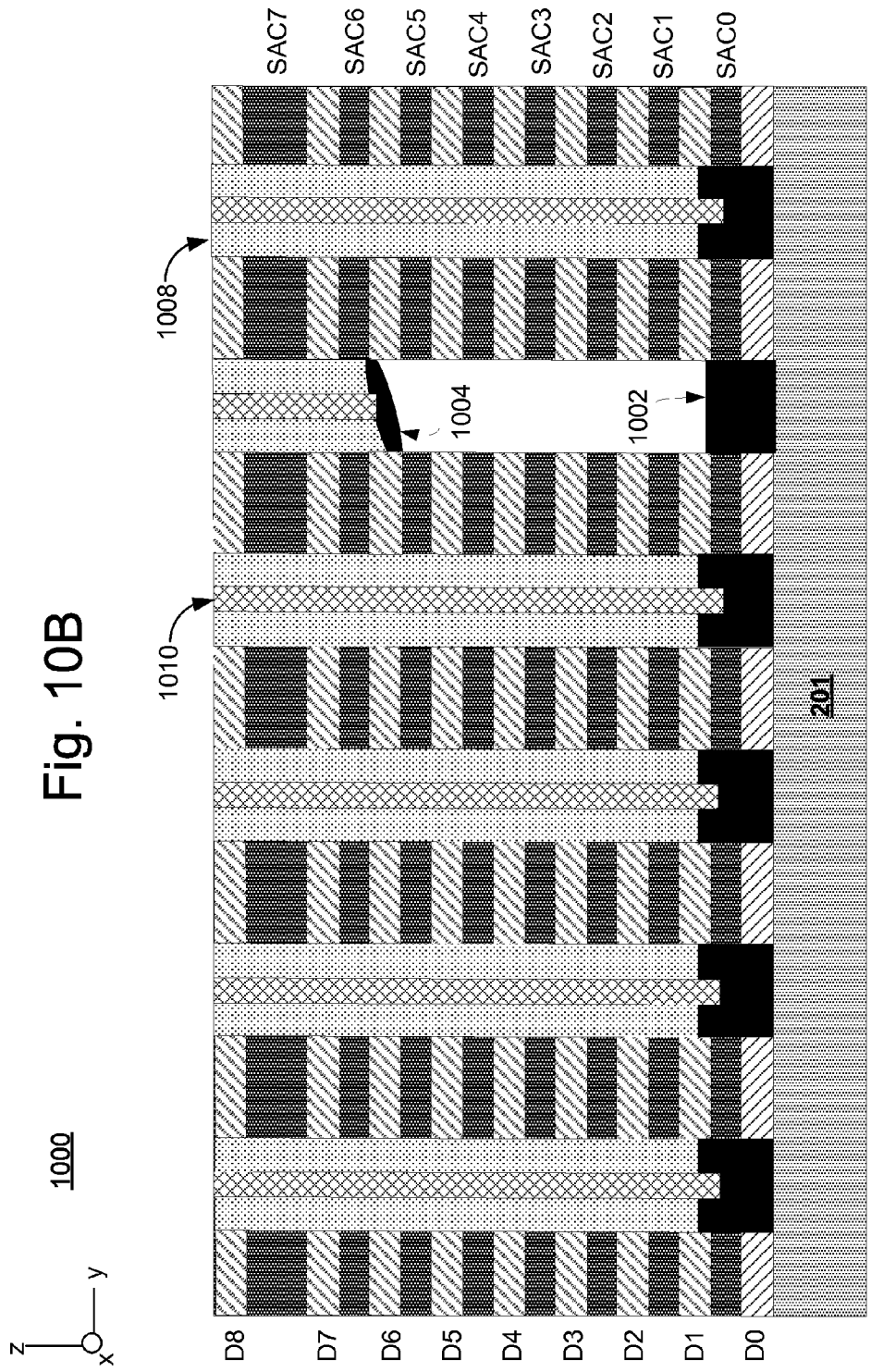

FIG. 10B shows formation after the memory cell material 1008 has been deposited into the memory holes. Also, the material for the NAND string channels 1010 has been formed. The memory cell material 1008 may be ONO as previously discussed. Thus, material 1008 may be similar to layer 869. The NAND string channels 1010 could be a hollow cylindrical layer of polysilicon for the NAND string channel with a silicon oxide core that extends vertically from bottom to top. Thus, the entire NAND string channel is not required to be mono-crystalline silicon. However, the entire NAND string channel could be mono-crystalline silicon. The epitaxial silicon growth 1002 at the bottom of the memory hole may be used for a source node of a select gate transistor of the NAND string. FIG. 10B shows that the unintentional silicon growth 1004 has prevented the memory cell material 1008 and the NAND string channel 1010 from being formed below the growth 1004.

FIG. 10C shows what happens after the sacrificial silicon nitride is removed. Note that layers SAC0-SAC7 have been removed. The sacrificial silicon nitride may be removed by etching slits or voids in the horizontal layers, and removing the sacrificial silicon nitride by performing an etch through the slits or voids.

Figure 10D:
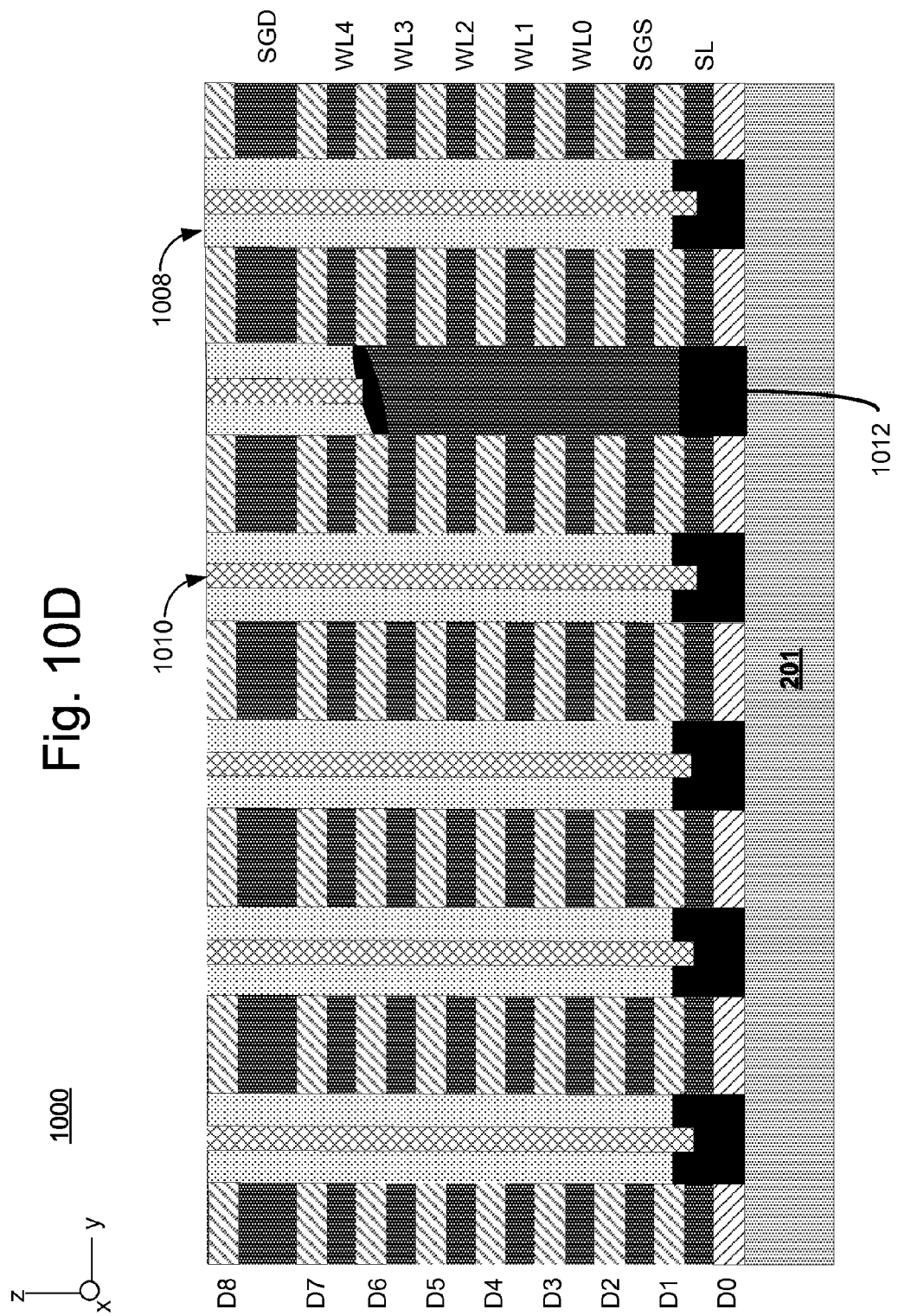

FIG. 10D shows results after the sacrificial silicon nitride has been replaced with a conductor, such as metal. However, the lower portion of one of the memory holes is filled with metal rather than memory cell material 1008 and a NAND string channel 1010. Note that layers SAC0-SAC7 have been replaced by SL, SGS, WL0-WL4 and SGD. The SL layer is a source line for the NAND strings. The source line (SL) is electrically connected to the source 1012 of the select gate transistor of the NAND string.

FIG. 11 is flowchart describing one embodiment of a process for passivating unintentional nucleation sites on sidewalls of memory holes when forming NAND strings. This process starts by forming alternating silicon oxide and silicon nitride layers, in step 1102. Next, slits are etched in step 1104. The slits are filled with insulation in step 1106. Memory holes are etched in step 1108. Steps 1102, 1104, 1106, and 1108 are similar to steps 702, 704, 706 and 708, respectively.

As noted above, there may be nucleation sites on sidewalls of the memory holes prior to, as well as during epitaxial growth of silicon. Step 1110 is passivating dangling bonds. Step 1110 includes introducing nitrogen into the memory holes in one embodiment. The nitrogen has a gas flow rate of between about 10 to 50 sccm. However, a higher or lower flow rate may be used. The nitrogen (e.g., $N_2$) flow passivates silicon nucleation sites (e.g., passivates dangling bonds).

FIG. 12A shows results after step 1110. FIG. 12A shows a stack during formation of a 3D memory array. FIG. 12A shows that each of the dangling silicon bonds on the vertical sidewalls of the memory holes has been passivated. Specifically, a nitrogen (N) atom may bond with two silicon (Si) atoms as depicted in the expanded portion. Thus, the dangling silicon bonds are passivated. Therefore, the dangling silicon bonds no longer serve as nucleation sites for growth of silicon. Thus, a clog 1004 (see FIG. 10A) may be prevented.

Step 1112 includes growing mono-crystalline silicon from the substrate using, for example, vapor phase epitaxy. In one embodiment, precursors such as dicholorosilane (DCS) and HCl are used. When using such precursors, the gas flow rates may be 50 to 150 sccm for HCl and 100 to 400 sccm for DCS. An example pressure is about 10 to 30 mTorr. An example range of temperatures is 750 to 850 degrees Celsius. However, higher or lower temperatures can be used. The growth rate may increase with temperature.

A precursor other than dicholorosilane (DCS) and HCl could be used. In one embodiment, neopentosilane (NPS) $Si_5H_{12}$ is used as precursor. Use of NPS as a precursor can significantly speed the growth of mono-crystalline silicon in the channel holes. An example range of temperatures is 600 to 650 degrees Celsius. However, higher or lower temperatures can be used.

Figure 12B:
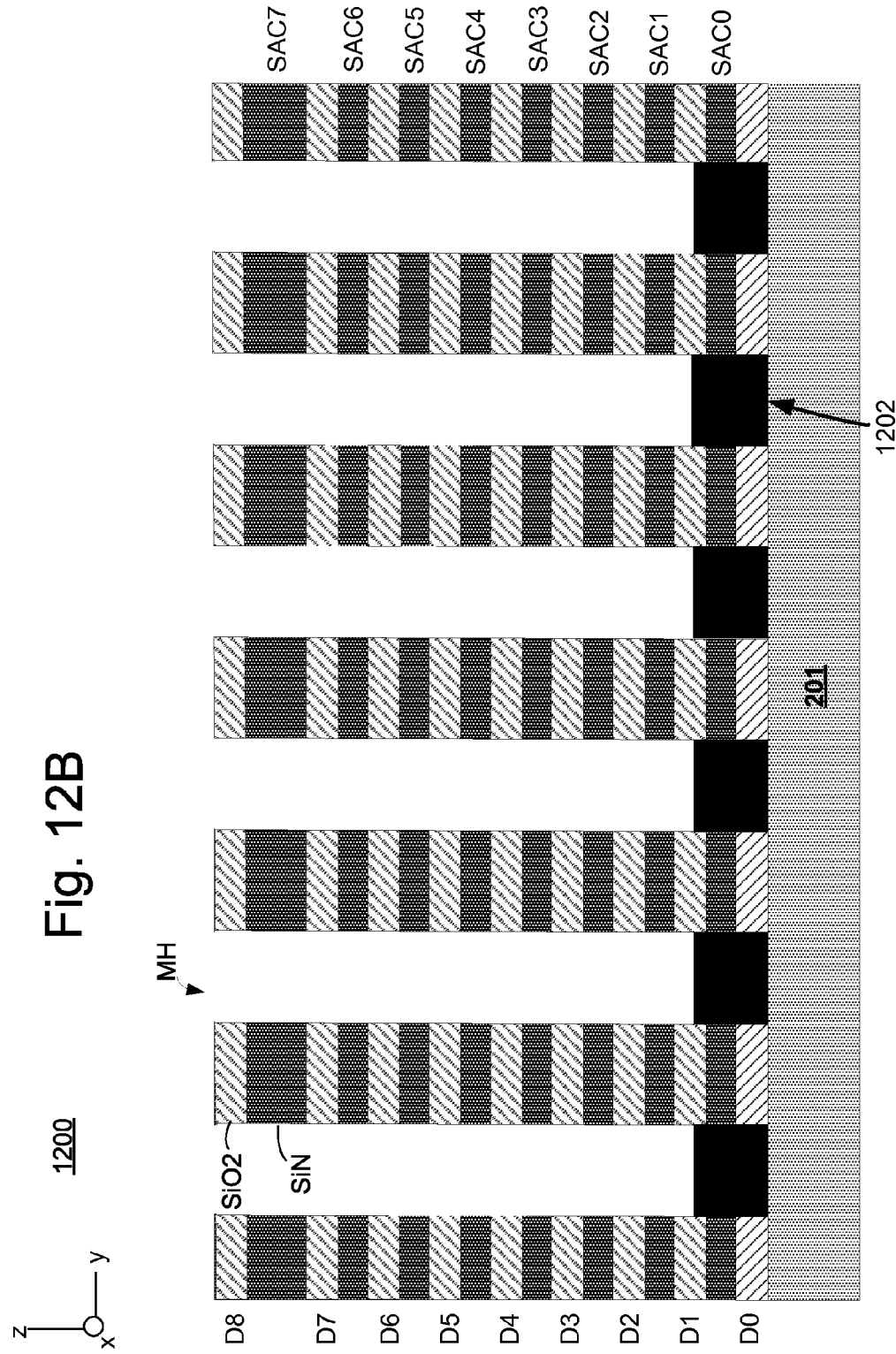

FIG. 12B depicts results after step 1112. The passivated silicon bonds are not shown so as to not obscure the diagram. The mono-crystalline silicon 1202 is shown at the bottom of the memory holes. It is in direct physical and electrical contact with the substrate 201, which may be silicon. The mono-crystalline silicon 1202 is at least as high as the first sacrificial layer SAC0 in this example. The mono-crystalline silicon 1202 might be a little higher, such as extending part way into dielectric layer D1. Note that SAC0 layer will eventually be the SL layer for the source line.

Step 1114 is to fill in the memory holes with several layers of material. In one embodiment, the layers from outside in could comprise: $Al_2O_3$, $SiO_2$, SiN, $SiO_2$, SiON, ISSG oxide. In this example, the SiN is the charge trapping layer. In this example, the tunnel oxide includes three layers: $SiO_2$, SiON, and ISSG formed oxide. A difference being that the material is formed with the mono-crystalline silicon 1202 at the bottom of the memory holes. In this example, the $Al_2O_3$ and the first $SiO_2$ layer is the blocking layer.

In one embodiment of step 1114, the blocking layer is not formed yet. Instead an ISSG generated oxide layer is formed as a protective layer for the charge trapping layer. Thus, processing can be similar to step 710b of FIG. 7.

Step 1116 is to deposit amorphous silicon over the tunnel oxide. This layer serves as a protective layer for the tunnel oxide during etching of the bottom of the memory hole. It will also serve as a portion of the silicon NAND string channel. Thus, in this process, the NAND channel is formed by two separate deposition steps.

Step 1118 is to etch the bottom of the memory holes. This step may be similar to step 714. A difference being that the etch exposes the mono-crystalline silicon 1202 rather than the substrate 201.

Step 1120 is a pre-clean step, which cleans the silicon that was deposited in step 1116.

Step 1122 is to form the NAND channel. Step 1122 includes deposition of a second layer of amorphous silicon. This second layer is formed in direct contact with the first layer. Step 1122 may also include a crystallization step to convert the amorphous silicon to polycrystalline silicon. Both the first and second layers of amorphous silicon may be crystallized in this step. The NAND channel has a hollow cylindrical shape in one embodiment after step 1122.

Step 1124 is to form a silicon oxide core within the central axis of the NAND channel.

Figure 12C:
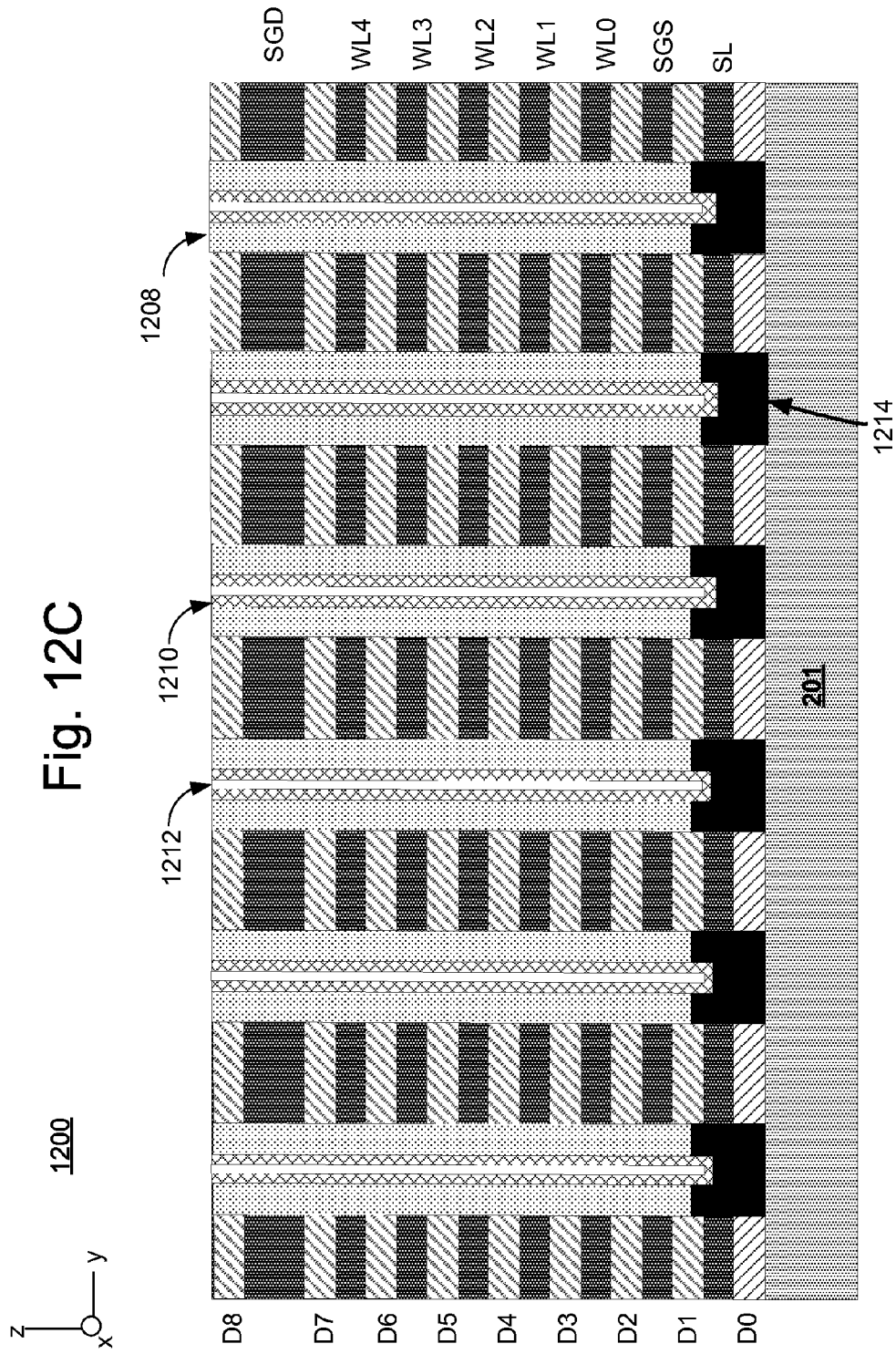
Figure 12D:
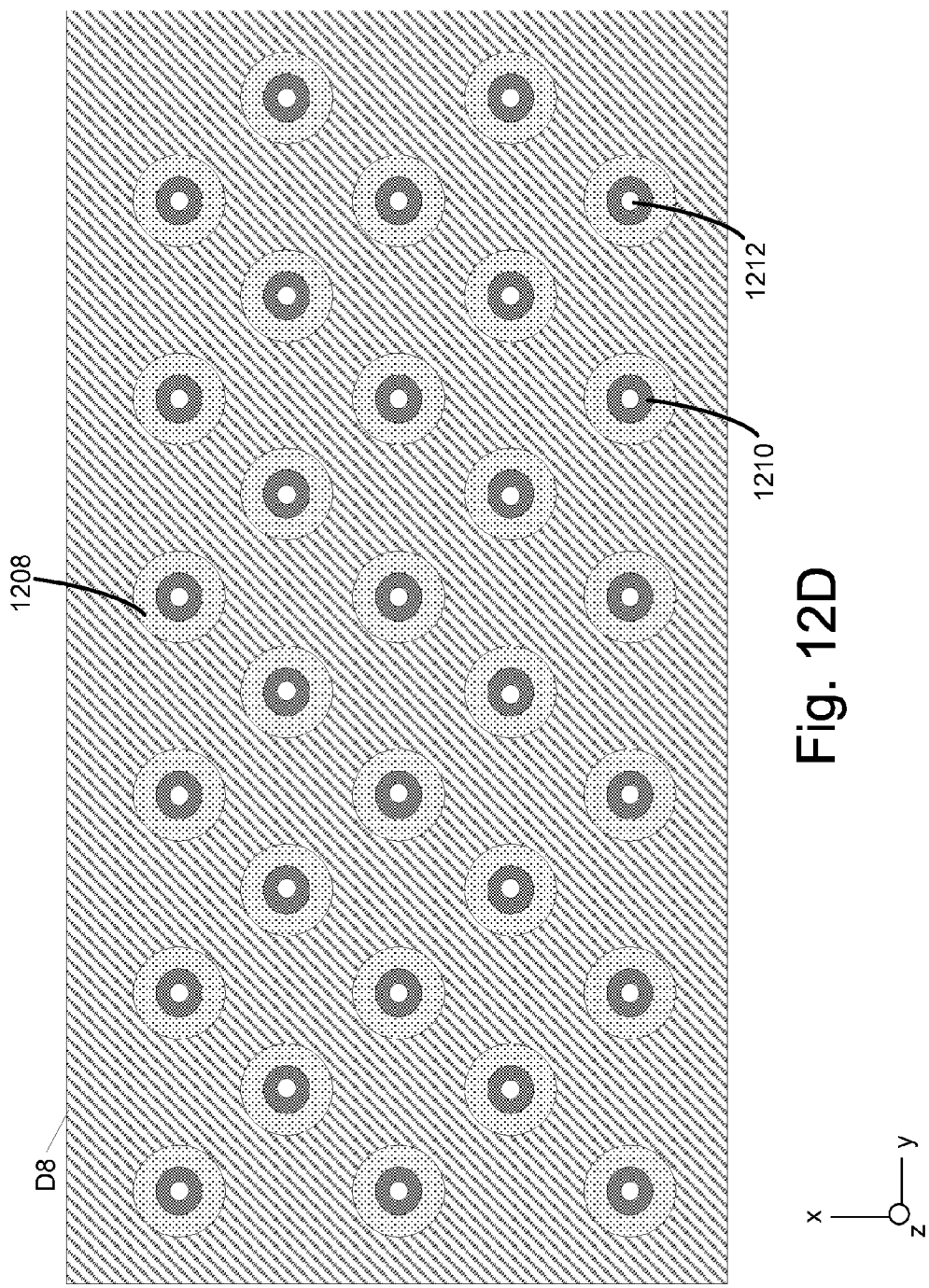

Steps 1126-1132 replace the sacrificial silicon nitride with metal. Steps 1126, 1128, 1130, and 1132 may be similar to steps 726, 728, 730 and 732, respectively, from FIG. 7. Note that step 729 of FIG. 7 (forming blocking layer) could also be performed between steps 1128 and 1130. Results after step 1132 are depicted in FIGS. 12C and 12D. FIGS. 12C and 12D show the vertically oriented silicon NAND channel 1210. There is a silicon oxide core 1212 in the central axis of the NAND channel 1210. Region 1208 surrounds the NAND channel 1210. Region 1208 represents the material that was deposited in step 1114. Note that layers SAC0-SAC7 have been replaced by SL, SGS, WL0-WL4 and SGD. The SL layer is a source line for the NAND strings. The source line (SL) is electrically connected to the source 1214 of the select gate transistor of the NAND string. The SGS layer is a source gate select line that connects to the gate of the select gate transistor.

Figure 13:
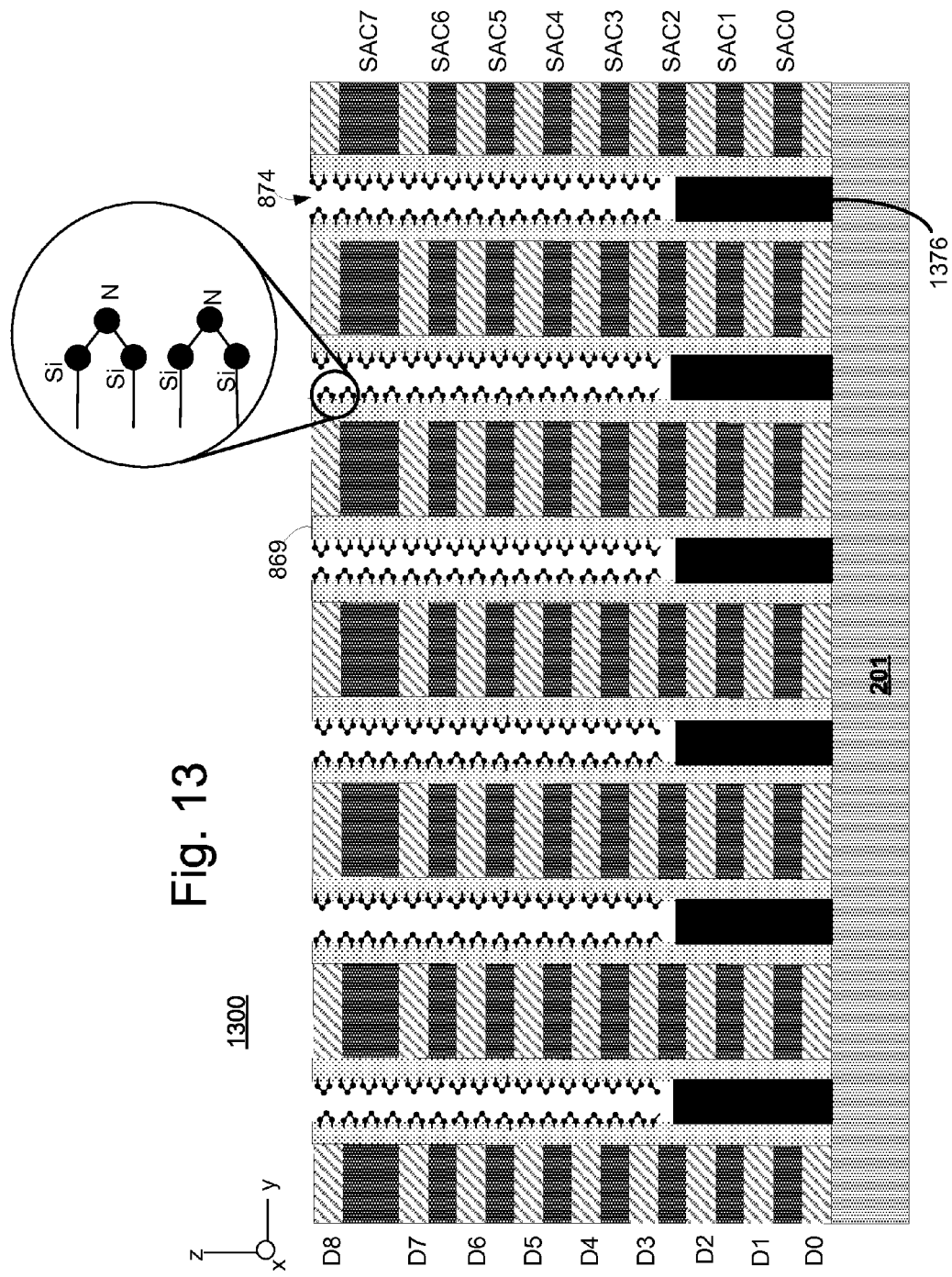
FIG. 13 depicts passivating dangling bonds during one embodiment of the process of FIG. 9.

As noted above, passivation of dangling bonds can be performed during a process such as the process of FIG. 9. FIG. 13 depicts a stack 1300 during formation of one embodiment of the process of FIG. 9. Memory holes have been formed in alternating horizontal layers of silicon oxide and silicon nitride. Memory cell material 869 has been formed on the vertical sidewalls of the memory holes, leaving a channel hole 874. The vertical sidewalls of the channel holes 874 may be prone to developing nucleation sites for silicon growth. These nucleation sites may be dangling silicon bonds. The dangling silicon bonds have been passivated with nitrogen, in this embodiment. Thus, the epitaxial growth of mono-crystalline silicon 1376 can proceed from bottom to top of the channel holes 874.

One embodiment disclosed herein includes fabricating a three-dimensional (3D) non-volatile storage device, comprising the following. A plurality of horizontal layers of material are formed above a substrate. Memory holes are formed that extend vertically through the plurality of horizontal layers of material to the substrate. A vertically-oriented NAND string is formed in each of the memory holes. Each vertically-oriented NAND string comprises a plurality of non-volatile storage elements and a vertically-oriented NAND string channel. Forming an individual one of the NAND strings in a given memory hole includes forming material for the plurality of non-volatile storage elements for the NAND string in the given memory hole leaving a channel hole that extends vertically through the plurality of horizontal layers of material to the substrate. The non-volatile storage elements of the NAND string surround the channel hole. Forming an individual one of the NAND strings also includes forming the vertically-oriented NAND string channel in the channel hole, which comprises growing monolithic crystalline silicon upwards from the substrate through all of the plurality of horizontal layers of material.

In one embodiment, growing the monolithic crystalline silicon upwards from the substrate through all of the plurality of horizontal layers of material comprises using vapor phase epitaxial growth to grow the monolithic crystalline silicon in the channel hole upwards from the bottom of the vertically-oriented NAND channel upwards to the top of the vertically-oriented NAND channel.

In one embodiment, growing the monolithic crystalline silicon upwards from the substrate through all of the plurality of horizontal layers of material comprises synthesizing a nanowire of monolithic crystalline silicon in the channel hole from the substrate at the bottom of the vertically-oriented NAND channel upwards to the top of the vertically-oriented NAND channel.

One embodiment disclosed herein includes a method for fabricating a three-dimensional (3D) non-volatile storage device. A first plurality of horizontal layers are formed of a first material above a substrate. A second plurality of horizontal layers are formed of a second material above the substrate. The second plurality of horizontal layers alternate with the first plurality of horizontal layers. Memory holes are formed that extend vertically through all of the first and second plurality of horizontal layers to the substrate. A vertically-oriented NAND string is formed in each of the memory holes. Each vertically-oriented NAND string comprises a plurality of non-volatile storage elements and a vertically-oriented NAND string channel. Forming the vertically-oriented NAND string channel comprises synthesizing a nanowire of mono-crystalline silicon in each respective memory hole from the substrate upwards for the entire length of the NAND string channel.

One embodiment includes a method for fabricating a three-dimensional (3D) non-volatile storage device, comprising the following. A first plurality of horizontal layers of sacrificial material are formed above a substrate. A second plurality of horizontal layers of insulating material are formed that alternate with the first plurality of horizontal layers of sacrificial material in a stack above the substrate. Memory holes are formed that extend vertically through the horizontal layers of insulating material and the horizontal layers of sacrificial material. A vertically-oriented NAND string is formed in each of the memory holes. Each vertically-oriented NAND string comprises a plurality of non-volatile storage elements and a vertically-oriented NAND string channel. Forming the NAND strings includes forming material for the plurality of non-volatile storage elements in the memory holes leaving a channel hole that extends vertically from the substrate through the horizontal layers of insulating material and the horizontal layers of sacrificial material. Forming the NAND strings further includes forming the vertically-oriented NAND string channel in the channel hole comprising using vapor phase epitaxial growth to grow mono-crystalline silicon upwards from the substrate through all of the horizontal layers of insulating material and all of the horizontal layers of sacrificial material, the mono-crystalline silicon completely filling the channel hole. The sacrificial material is removed from the first plurality of horizontal layers of sacrificial material. Conductive material is deposited in place of the removed sacrificial material.

One embodiment includes a method for fabricating a three-dimensional (3D) non-volatile storage device, which comprises the following. A plurality of horizontal layers of material are formed above a substrate. Memory holes are formed that extend vertically through the plurality of horizontal layers of material. A vertically-oriented NAND string is formed in each of the memory holes. Each of the vertically-oriented NAND strings comprises a plurality of non-volatile storage elements and a vertically-oriented NAND string channel. Forming the vertically-oriented NAND string in each of the memory holes includes introducing nitrogen gas into the memory holes to passivate silicon dangling bonds, and growing mono-crystalline silicon upwards in the memory holes from the substrate after introducing the nitrogen gas into the memory holes.

One embodiment includes a method for fabricating a three-dimensional (3D) non-volatile storage device, which comprises the following. A plurality of horizontal layers are formed above a substrate. At least some of the plurality of horizontal layers comprise silicon. Memory holes are formed that extend vertically through the plurality of horizontal layers. The memory holes have vertical sidewalls. A vertically-oriented NAND string is formed in each of the memory holes. Each vertically-oriented NAND string comprises a plurality of non-volatile storage elements and a vertically-oriented NAND string channel. Forming the vertically-oriented NAND string in each of the memory holes includes introducing nitrogen gas into the memory holes to passivate silicon nucleation sites on the vertical sidewalls of the memory holes, and epitaxially growing mono-crystalline silicon upwards in the memory holes from the substrate after introducing the nitrogen gas into the memory holes.

One embodiment includes a method for fabricating a three-dimensional (3D) non-volatile storage device, which includes the following. A first plurality of horizontal layers of sacrificial material are formed above a substrate. A second plurality of horizontal layers of insulating material are formed alternating with the first plurality of horizontal layers of sacrificial material in a stack above the substrate. Memory holes are formed that extend vertically through the horizontal layers of insulating material and the horizontal layers of sacrificial material. The memory holes have vertical sidewalls. A vertically-oriented NAND string is formed in each of the memory holes. Each vertically-oriented NAND string comprises a plurality of non-volatile storage elements and a vertically-oriented NAND string channel. The vertically-oriented NAND strings each have a source side select transistor having a source node. Forming the NAND strings includes: introducing nitrogen gas into the memory holes to passivate silicon dangling bonds on the vertical sidewalls of the memory holes; epitaxially growing mono-crystalline silicon in the memory holes after introducing the nitrogen gas into the memory holes, wherein growing the mono-crystalline silicon upwards in the memory holes comprises forming the source nodes of the source side select gate transistors of the vertically-oriented NAND strings; forming material for the plurality of non-volatile storage elements in the memory holes above the mono-crystalline silicon leaving a channel hole above the mono-crystalline silicon in each of the memory holes; and forming the vertically-oriented NAND string channels in the channel holes. The sacrificial material is removed from the first plurality of horizontal layers of sacrificial material. Conductive material is deposited in place of the removed sacrificial material to form word lines for the vertically-oriented NAND strings in the memory holes.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A method for fabricating a three-dimensional (3D) non-volatile storage device, the method comprising:
   forming a plurality of horizontal layers of material above a substrate;
   forming memory holes that extend vertically through the plurality of horizontal layers of material to the substrate;
   forming a vertically-oriented NAND string in each of the memory holes, each vertically-oriented NAND string comprising a plurality of non-volatile storage elements and a vertically-oriented NAND string channel having a bottom at the substrate and a top at an uppermost of the plurality of horizontal layers of material, forming an individual one of the NAND strings in a given memory hole including:
   forming material for the plurality of non-volatile storage elements for the NAND string in the given memory hole leaving a channel hole that extends vertically through the plurality of horizontal layers of material to the substrate, the non-volatile storage elements of the NAND string surround the channel hole; and
   forming the vertically-oriented NAND string channel in the channel hole comprising growing monolithic crystalline silicon upwards from the substrate through all of the plurality of horizontal layers of material, comprising using neopentosilane as a precursor in vapor phase epitaxial growth to grow the monolithic crystalline silicon in the channel hole upwards from the bottom of the vertically-oriented NAND channel upwards to the top of the vertically-oriented NAND channel.

2. The method of claim 1, wherein the channel hole has vertical sidewalls, and further comprising:
   using a nitrogen gas flow to passivate silicon nucleation sites on the sidewalls of the channel hole prior to growing the monolithic crystalline silicon upwards from the substrate through all of the plurality of horizontal layers of material.

3. The method of claim 1, wherein growing the monolithic crystalline silicon upwards from the substrate through all of the plurality of horizontal layers of material comprises:
   forming a vertical NAND string channel having a solid monolithic crystalline silicon core for the entire vertical length of the vertical NAND string channel.

4. The method of claim 1, further comprising:
   forming word lines in a group of the plurality of horizontal layers of material, the word lines being associated with the vertically-oriented NAND strings in the memory holes.

5. A method for fabricating a three-dimensional (3D) non-volatile storage device, the method comprising:
   forming a first plurality of horizontal layers of silicon oxide above a substrate;
   forming a second plurality of horizontal layers of silicon nitride above the substrate, the second plurality of horizontal layers alternating with the first plurality of horizontal layers;
   forming memory holes that extend vertically through all of the first and second plurality of horizontal layers to the substrate;
   forming a vertically-oriented NAND string in each of the memory holes, each vertically-oriented NAND string comprising a plurality of non-volatile storage elements and a vertically-oriented NAND string channel, wherein forming the vertically-oriented NAND string channel comprises growing a nanowire of mono-crystalline silicon in each respective memory hole from the substrate upwards for the entire length of the NAND string channel; and
   replacing the silicon nitride in the second plurality of horizontal layers with metal to form word lines that are associated with the NAND strings.

6. The method of claim 5, wherein growing a nanowire of mono-crystalline silicon in each respective memory hole from the substrate upwards for the entire length of the NAND string channel comprises:
   using vapor-liquid-solid (VLS) synthesis to grow the mono-crystalline silicon in the memory hole from the substrate upwards for the entire length of the NAND string channel.

7. The method of claim 6, growing a nanowire of mono-crystalline silicon in each respective memory hole from the substrate upwards for the entire length of the NAND string channel comprises:
   forming gold nano-clusters in the memory holes on the substrate;
   introducing a reactant source of silicon into the memory holes after forming the gold nano-clusters; and
   annealing at a temperature higher than the gold-silicon eutectic point after introducing the reactant source of silicon.

8. The method of claim 7, wherein introducing the reactant source of silicon into the memory holes comprises:
   using disilane ($Si_2H_6$) as the reactant source.

9. The method of claim 5, wherein the memory holes each have a bottom at the substrate and a top at an uppermost of the first and second plurality of horizontal layers, wherein growing a nanowire of mono-crystalline silicon in each respective memory hole from the substrate upwards for the entire length of the NAND string channel comprises:
   growing a single nanowire of monolithic crystalline silicon from the substrate at the bottom of the memory hole to the top of the memory hole.

10. A method for fabricating a three-dimensional (3D) non-volatile storage device, the method comprising:
   forming a first plurality of horizontal layers of sacrificial material above a substrate;
   forming a second plurality of horizontal layers of insulating material alternating with the first plurality of horizontal layers of sacrificial material in a stack above the substrate; and
   forming memory holes that extend vertically through the horizontal layers of insulating material and the horizontal layers of sacrificial material;
   forming a vertically-oriented NAND string in each of the memory holes, each vertically-oriented NAND string comprising a plurality of non-volatile storage elements and a vertically-oriented NAND string channel, forming the NAND strings including:
   forming material for the plurality of non-volatile storage elements in the memory holes leaving a channel hole that extends vertically from the substrate through the horizontal layers of insulating material and the horizontal layers of sacrificial material; and forming the vertically-oriented NAND string channel in the channel hole comprising using vapor phase epitaxial growth to grow mono-crystalline silicon upwards from the substrate through all of the horizontal layers of insulating material and all of the horizontal layers of sacrificial material, using the vapor phase epitaxial growth comprises using neopentosilane as a precursor, the mono-crystalline silicon completely filling the channel hole;

removing the sacrificial material from the first plurality of horizontal layers of sacrificial material; and depositing conductive material in place of the removed sacrificial material.

11. The method of claim 10, wherein the channel hole has vertical sidewalls that extend from the substrate through the first plurality of horizontal sacrificial layers and the second plurality of horizontal insulating layers, and further comprising:

introducing nitrogen gas into the channel holes to passivate silicon dangling bonds on the vertical sidewalls of the channel hole prior to using vapor phase epitaxial growth to grow the mono-crystalline silicon.

12. The method of claim 10, wherein using vapor phase epitaxial growth to grow the mono-crystalline silicon upwards from the substrate through all of the horizontal layers of insulating material and all of the horizontal layers of sacrificial material comprises:

growing the mono-crystalline silicon to a height of at least 4 micrometers.

13. A method for fabricating a three-dimensional (3D) non-volatile storage device, the method comprising:

forming a plurality of horizontal layers of material above a substrate;

forming memory holes that extend vertically through the plurality of horizontal layers of material;

forming a vertically-oriented NAND string in each of the memory holes, each vertically-oriented NAND string comprising a plurality of non-volatile storage elements and a vertically-oriented NAND string channel, wherein forming the vertically-oriented NAND string in each of the memory holes includes:

introducing nitrogen gas into the memory holes to passivate silicon dangling bonds; and growing mono-crystalline silicon upwards in the memory holes from the substrate after introducing the nitrogen gas into the memory holes.

14. The method of claim 13, wherein the vertically-oriented NAND strings each have a source side select gate transistor having a source node, wherein growing the mono-crystalline silicon upwards in the memory holes from the substrate after introducing the nitrogen gas into the memory holes comprises forming the source nodes of the source side select gate transistors of the vertically-oriented NAND strings.

15. The method of claim 13, wherein the memory holes have vertical sidewalls, wherein introducing the nitrogen gas into the memory holes to passivate silicon dangling bonds comprises:

introducing nitrogen gas into the memory holes to passivate silicon dangling bonds on the vertical sidewalls of the memory holes.

16. The method of claim 13, wherein growing mono-crystalline silicon upwards in the memory holes from the substrate after introducing the nitrogen gas into the memory holes comprises:

using vapor phase epitaxy to grow the mono-crystalline silicon.

17. A method for fabricating a three-dimensional (3D) non-volatile storage device, the method comprising:

forming a plurality of horizontal layers above a substrate, at least some of the plurality of horizontal layers comprising silicon;

forming memory holes that extend vertically through the plurality of horizontal layers, the memory holes having vertical sidewalls;

forming a vertically-oriented NAND string in each of the memory holes, each vertically-oriented NAND string comprising a plurality of non-volatile storage elements and a vertically-oriented NAND string channel, forming the vertically-oriented NAND string in each of the memory holes including:

introducing nitrogen gas into the memory holes to passivate silicon nucleation sites on the vertical sidewalls of the memory holes; and epitaxially growing mono-crystalline silicon upwards in the memory holes from the substrate after introducing the nitrogen gas into the memory holes.

18. The method of claim 17, wherein the memory holes have a bottom at the substrate and a top, wherein epitaxially growing mono-crystalline silicon upwards in the memory holes from the substrate comprises:

epitaxially growing mono-crystalline silicon from the substrate to only one of the lower layers of the plurality of horizontal layers.

19. The method of claim 17, wherein the forming a plurality of horizontal layers above a substrate comprises:

forming alternating horizontal layers of silicon oxide and silicon nitride above the substrate.

20. The method of claim 19, further comprising:

replacing the silicon nitride with metal after forming the vertically-oriented NAND string in each of the memory holes, the metal being word lines associated with the vertically-oriented NAND strings.

21. A method for fabricating a three-dimensional (3D) non-volatile storage device, the method comprising:

forming a first plurality of horizontal layers of sacrificial material above a substrate;

forming a second plurality of horizontal layers of insulating material alternating with the first plurality of horizontal layers of sacrificial material in a stack above the substrate; and forming memory holes that extend vertically through the horizontal layers of insulating material and the horizontal layers of sacrificial material, the memory holes having vertical sidewalls;

forming a vertically-oriented NAND string in each of the memory holes, each vertically-oriented NAND string comprising a plurality of non-volatile storage elements and a vertically-oriented NAND string channel, wherein the vertically-oriented NAND strings each have a source side select transistor having a source node, forming the NAND strings including:

introducing nitrogen gas into the memory holes to passivate silicon dangling bonds on the vertical sidewalls of the memory holes;

epitaxially growing mono-crystalline silicon in the memory holes after introducing the nitrogen gas into the memory holes, wherein growing the mono-crystalline silicon upwards in the memory holes comprises forming the source nodes of the source side select gate transistors of the vertically-oriented NAND strings;

forming material for the plurality of non-volatile storage elements in the memory holes above the mono-crystalline silicon leaving a channel hole above the mono-crystalline silicon in each of the memory holes; and forming the vertically-oriented NAND string channels in the channel holes;

removing the sacrificial material from the first plurality of horizontal layers of sacrificial material; and depositing conductive material in place of the removed sacrificial material to form word lines for the vertically-oriented NAND strings in the memory holes.

22. The method of claim 21, wherein the epitaxially growing mono-crystalline silicon in the memory holes comprises:

using vapor phase epitaxy to grow the mono-crystalline silicon.

* * * * *